(12) United States Patent
Zeng et al.

(10) Patent No.: US 11,348,359 B2
(45) Date of Patent: May 31, 2022

(54) DISPLAY PANEL, DISPLAY APPARATUS AND METHOD FOR FINGERPRINT RECOGNITION

(71) Applicant: Shanghai Tianma Micro-Electronics Co., Ltd., Shanghai (CN)

(72) Inventors: Yang Zeng, Shanghai (CN); Feng Lu, Shanghai (CN); Haochi Yu, Shanghai (CN); Qing Zhang, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 347 days.

(21) Appl. No.: 16/453,994

(22) Filed: Jun. 26, 2019

(65) Prior Publication Data
US 2020/0242320 A1    Jul. 30, 2020

(30) Foreign Application Priority Data

Jan. 29, 2019   (CN) .......................... 201910084712.9

(51) Int. Cl.
| | |
|---|---|
| G06V 10/147 | (2022.01) |
| G06V 40/13 | (2022.01) |
| H01L 27/146 | (2006.01) |
| G02B 5/30 | (2006.01) |
| G06V 10/141 | (2022.01) |

(52) U.S. Cl.
CPC ........ *G06V 40/1318* (2022.01); *G02B 5/3016* (2013.01); *G06V 10/141* (2022.01); *G06V 10/147* (2022.01); *H01L 27/14621* (2013.01); *H01L 27/14623* (2013.01); *H01L 27/14625* (2013.01); *H01L 27/14678* (2013.01)

(58) Field of Classification Search
CPC ............. G06K 9/0004; G06K 9/00046; G06K 9/00013; G02F 1/133528; G02B 5/3025
See application file for complete search history.

(56) References Cited

U.S. PATENT DOCUMENTS

| | | | | |
|---|---|---|---|---|
| 2006/0011913 A1* | 1/2006 | Yamazaki | ........... | H01L 27/1214 257/59 |
| 2012/0162167 A1* | 6/2012 | Kurokawa | ............ | G06F 3/0412 345/207 |
| 2018/0068160 A1* | 3/2018 | Wu | ..................... | G06K 9/00201 |

(Continued)

FOREIGN PATENT DOCUMENTS

| | | |
|---|---|---|
| CN | 105093679 A | 11/2015 |
| CN | 106847872 A | 6/2017 |
| CN | 106980850 A | 7/2017 |

*Primary Examiner* — Yuzhen Shen
(74) *Attorney, Agent, or Firm* — Anova Law Group, PLLC

(57) ABSTRACT

Display panel, display apparatus and method for fingerprint recognition are provided. The display panel includes a base layer, a light-emitting layer and a light-shielding layer having at least first and second imaging pinholes. The second imaging pinhole is disposed between two adjacent first imaging pinholes. The display panel further includes a light-sensitive fingerprint sensor layer and a fingerprint recognition light source generating first light during a first time period and second light during a second time period. The first light passes through the first imaging pinholes and the second imaging pinholes do not allow the first light to pass through, and the second light passes through the second imaging pinholes and the first imaging pinholes do not allow the second light to pass through.

17 Claims, 15 Drawing Sheets

(56) References Cited

U.S. PATENT DOCUMENTS

| | | | |
|---|---|---|---|
| 2019/0050621 A1* | 2/2019 | Xu | G06K 9/0004 |
| 2021/0083018 A1* | 3/2021 | Hu | H01L 31/173 |
| 2021/0088821 A1* | 3/2021 | Ding | G02F 1/133524 |

* cited by examiner

DISPLAY PANEL, DISPLAY APPARATUS AND METHOD FOR FINGERPRINT RECOGNITION

CROSS-REFERENCE TO RELATED APPLICATIONS

This application claims the priority of Chinese Patent Application No. 201910084712.9, filed on Jan. 29, 2019, the entire content of which is incorporated herein by reference.

FIELD OF THE DISCLOSURE

The present disclosure generally relates to the field of display technology and, more particularly, relates to a display panel, a display apparatus, and a method for fingerprint recognition.

BACKGROUND

Display devices, such as mobile phones, tablets and smart wearable devices, often have fingerprint recognition functions. Before operating a display device with the fingerprint recognition function, a user only needs to touch the display device with a finger to perform authority verification, which simplifies the authority verification process. Furthermore, with gradual increase in the scenarios of applying the fingerprint recognition functions, areas configured for fingerprint recognition on the display devices have been developed from a certain region on the display device to full-screen recognition.

In the existing display devices based on optical technologies for fingerprint recognition, a light-sensitive fingerprint sensor is formed based on semiconductor elements. The fingerprint detection is realized by utilizing the properties that the semiconductor elements generate leakage current when exposed to light. Specifically, light generated by the fingerprint recognition light source is reflected on a surface of the display device touch-controlled by the finger. The reflected light irradiates to the light-sensitive fingerprint recognition sensor, which detects the light intensity change caused by the fluctuation in the ridges and valleys of the fingerprint, thereby forming a fingerprint spectrum. However, the precision in fingerprint recognition in the existing technologies still needs to be improved.

Therefore, there is a need to solve technical problems to provide a display panel, a display apparatus, and a method for fingerprint recognition, such that the prevision in fingerprint recognition on the display panel is improved.

BRIEF SUMMARY OF THE DISCLOSURE

In view of above, the present disclosure provides a display panel, a display apparatus and a method for fingerprint recognition, to realize fingerprint recognition based on the principle of pinhole imaging. The present disclosure may support higher density of imaging pinholes, thereby improving the image uniformity and precision in fingerprint recognition.

One aspect of the present disclosure provides a display panel. The display panel may include a base layer and a light-emitting layer disposed on a side of the base layer, where the light-emitting layer may include a plurality of light-emitting units. The display panel may further include a light-shielding layer including a plurality of imaging pinholes, where at least a portion of an orthogonal projection of the plurality of imaging pinholes on the light-emitting layer may be disposed between adjacent light-emitting units. The plurality of imaging pinholes may at least include first imaging pinholes and second imaging pinholes, and one of the second imaging pinholes may be disposed between at least two adjacent first imaging pinholes. The display panel may further include a light-sensitive fingerprint sensor layer, where the light-shielding layer may be disposed on a side of the light-sensitive fingerprint sensor layer facing towards a light-exiting surface of the display panel, and a fingerprint recognition light source. The fingerprint recognition light source may generate first light during a first time period and generate second light during a second time period. The first light may pass through the first imaging pinholes and the second imaging pinholes may not allow the first light to pass through, and the second light may pass through the second imaging pinholes and the first imaging pinholes may not allow the second light to pass through.

Another aspect of the present disclosure provides a method for fingerprint recognition applicable to a display panel. The display panel may include a light-sensitive fingerprint sensor, a fingerprint recognition light source and a plurality of imaging pinholes at least including first imaging pinholes and second imaging pinholes, and one of the second imaging pinholes may be located between at least two adjacent first imaging pinholes. The method for fingerprint recognition may include the step of controlling the fingerprint recognition light source to generate first light during a first time period and recording information of a first image acquired by the light-sensitive fingerprint sensor, where the first light may pass through the first imaging pinholes and the second imaging pinholes may not allow the first light to pass through. The method for fingerprint recognition may further include the step of controlling the fingerprint recognition light source to generate second light during a second time period and recording information of a second image acquired by the light-sensitive fingerprint sensor, where the second light may pass through the second imaging pinholes and the first imaging pinholes may not allow the second light to pass through. The method for fingerprint recognition may further include the step of recognizing a fingerprint based on the information of the first image and the information of the second image.

Another aspect of the present disclosure provides a display apparatus, including a display panel. The display panel may include a base layer and a light-emitting layer disposed on a side of the base layer, where the light-emitting layer may include a plurality of light-emitting units. The display panel may further include a light-shielding layer including a plurality of imaging pinholes, where at least a portion of an orthogonal projection of the plurality of imaging pinholes on the light-emitting layer may be disposed between adjacent light-emitting units. The plurality of imaging pinholes may at least include first imaging pinholes and second imaging pinholes, and one of the second imaging pinholes may be disposed between at least two adjacent first imaging pinholes. The display panel may further include a light-sensitive fingerprint sensor layer, where the light-shielding layer may be disposed on a side of the light-sensitive fingerprint sensor layer facing towards a light-exiting surface of the display panel, and a fingerprint recognition light source. The fingerprint recognition light source may generate first light during a first time period and generate second light during a second time period. The first light may pass through the first imaging pinholes and the second imaging pinholes may not allow the first light to pass through, and the second light may pass through the second imaging pinholes and the first imaging pinholes may not allow the second light to pass through.

Other features and advantages of the present disclosure will become more apparent via a reading of detailed descriptions of non-limiting embodiments with reference to the accompanying drawings.

BRIEF DESCRIPTION OF THE DRAWINGS

The accompanying drawings, illustrating some embodiments of the present disclosures, constitute a part of the present disclosure. These accompanying drawings together with some of the embodiments will be described in the following to illustrate the technical solutions of the present disclosure.

DETAILED DESCRIPTION

Figure 1:
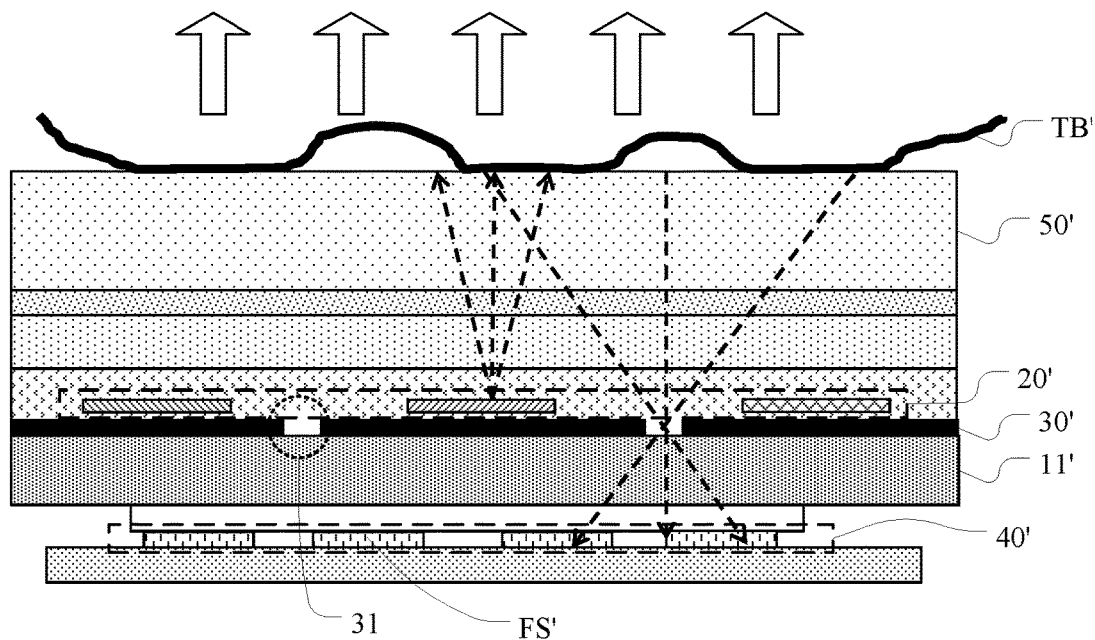
FIG. 1 illustrates a schematic diagram of film layer structures in display panels.

Various embodiments of the present disclosure will be described in detail as follows with reference to the accompanying drawings. It should be noted that the arrangements of the elements and steps as described in these embodiments, as well as the numeric expressions and numeric values are not intended to limit the scope of the present disclosure, unless otherwise specified.

It should be understood that, the descriptions of exemplary embodiments disclosed herein are only for illustrative purpose, not intended to limit any scope of the embodiments of the present disclosure or the implementation of these embodiments.

The technologies, methods and devices that are known to one of ordinary skill in the art will not be described in detail herein, however under certain circumstances, any technology, method and device as disclosed herein should be viewed as part of the present disclosure.

Any numeric value described in exemplary embodiments of the present disclosure is only for illustrative purposes, not intended to be limiting. Accordingly, different numeric values may be applied in other exemplary embodiments of the present disclosure.

It should be noted that similar reference numerals and letters indicate similar items in the following drawings. Thus, once an item is defined in one drawing, it is unnecessary for the item to be further discussed in subsequent drawings.

Display panel, display apparatus and method for fingerprint recognition are provided. The display panel includes a base layer, a light-emitting layer and a light-shielding layer having at least first and second imaging pinholes. The second imaging pinhole is disposed between two adjacent first imaging pinholes. The display panel further includes a light-sensitive fingerprint sensor layer and a fingerprint recognition light source generating first light during a first time period and second light during a second time period. The first light passes through the first imaging pinholes and is not able to pass through the second imaging pinholes, and the second light passes through the second imaging pinholes and is not able to pass through the first imaging pinholes. The present disclosure supports higher density of imaging pinholes under a fixed object-to-image distance without crosstalk between imaging pinholes, thereby improving image uniformity and precision in fingerprint recognition.

FIG. 1 illustrates a schematic diagram of film layer structures in the display panels. With reference to FIG. 1, the display panel includes a base layer 11' and a light-emitting layer 20' disposed on a side of the base layer 11'. A cover layer 50' is disposed on a side of the light-emitting layer 20' away from the base layer 11'. A surface of the cover layer 50' is a touch-control operation surface of the display device. The display panel further includes a light-sensitive fingerprint sensor layer 40' and a light shielding layer 30' where a plurality of imaging pinholes 31' are disposed. The light-emitting layer 20' is multiplexed as a fingerprint recognition light source. When light generated by the light-emitting layer 20' transmits to a touch surface between the fingerprint TB' and the cover layer 50', it reflects on the touch surface. The reflected light is incident to the light-sensitive fingerprint sensor layer 40' through the imaging pinholes 31'. When the apertures of the imaging pinholes 31' are small enough, the fingerprint can be imaged on the light-sensitive fingerprint sensor layer 40' based on the principle of pinhole imaging, thereby realizing the fingerprint recognition.

Figure 2:
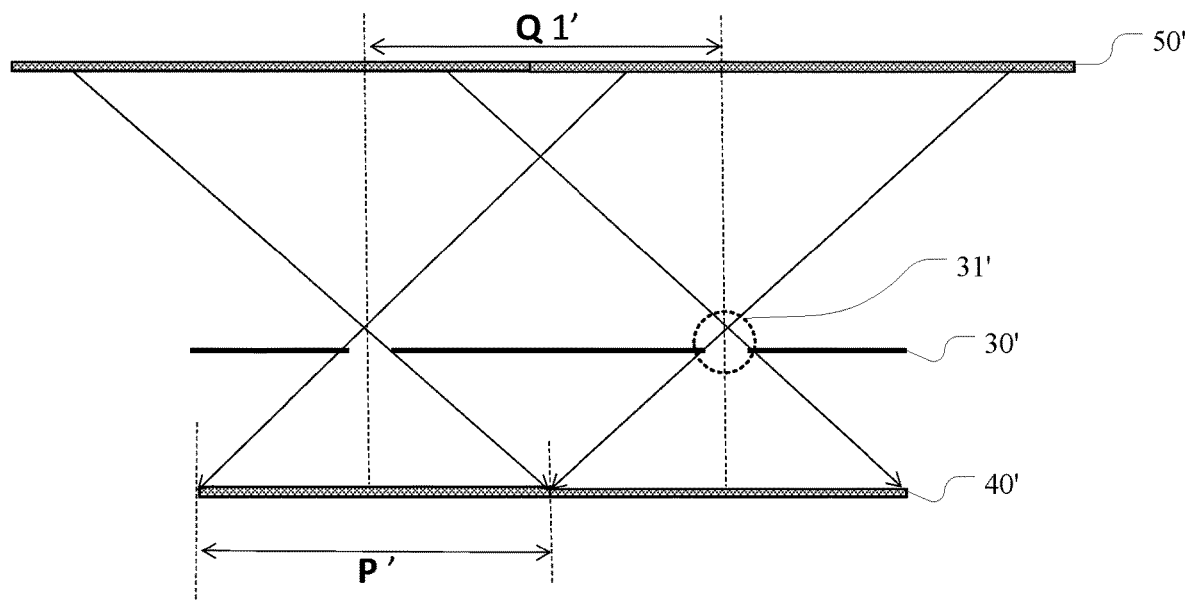
FIG. 2 illustrates a schematic diagram of imaging areas in display panels.
Figure 3:
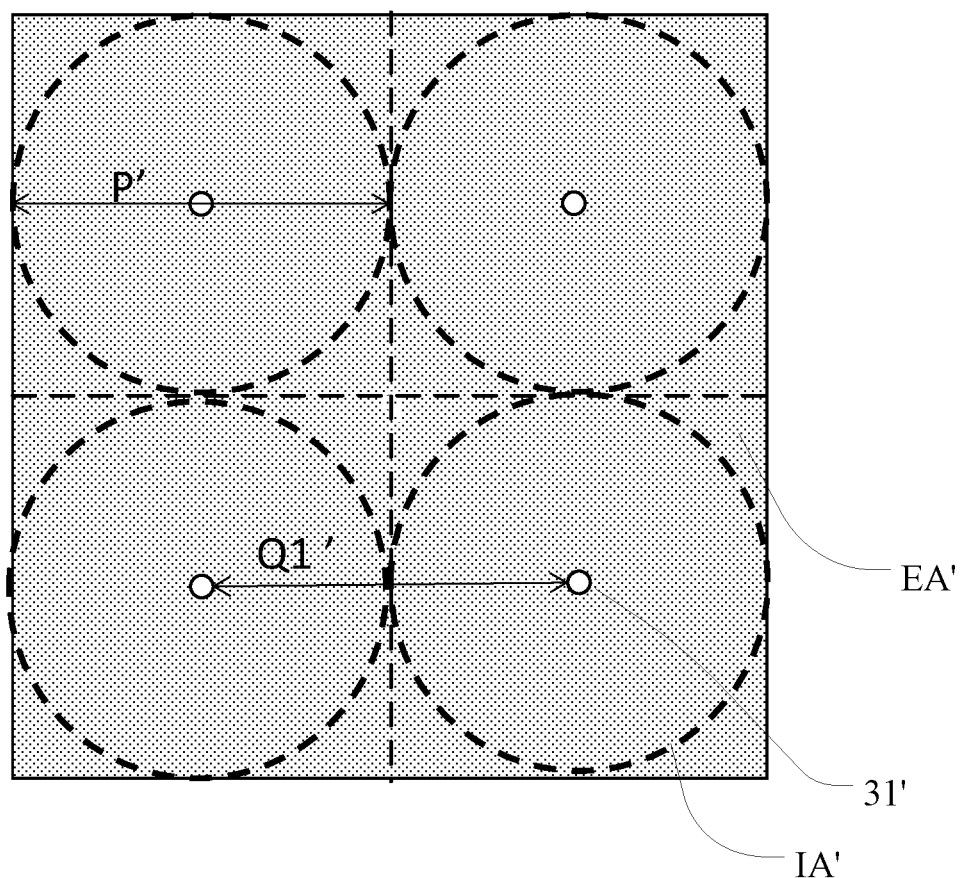
FIG. 3 illustrates another schematic diagram of imaging areas in display panels.

FIGS. 2-3 illustrate schematic diagram of imaging areas in the display panels. Using exemplary circular-shaped imaging pinholes 31' with reference to FIGS. 2-3, with fixed parameters including a viewing angle of the imaging pinholes and an object-to-image distance, one imaging pinhole 31' forms an imaging area IA' on the light-sensitive fingerprint sensor layer 40', where the imaging area IA' is a circular area with a radius of P'/2. The light-sensitive fingerprint sensor layer 40' includes a plurality of light-sensitive fingerprint sensors FS' corresponding to each of the imaging areas IA'. Further, a sensing area EA' is arranged where the plurality of light-sensitive fingerprint sensors FS' are disposed. The light-sensitive fingerprint sensors FS' detect each of the imaging areas IA' and based upon the images detected in all of the sensing areas EA', to realize fingerprint recognition. To prevent any crosstalk in the detected images between adjacent imaging pinholes, that is, light passing through one imaging pinhole 31' is incident to a sensing area EA' corresponding to another imaging pinhole 31', it is required to make a distance Q1 between adjacent imaging pinholes 31' larger than or equal to P'.

It is further found that for each imaging pinhole 31', the formed image has uneven brightness at edge positions which is further prone to distortion, resulting in imprecise image detected by the sensing areas EA' and reduced precision in fingerprint recognition. To improve the precision of fingerprint recognition, the distance between adjacent imaging pinholes 31' may be reduced. That is, in a same area to be recognized, more imaging pinholes 31' may be included to realize the fingerprint recognition. Nevertheless, with reference to FIGS. 2-3, when the distance Q1' between adjacent imaging pinholes 31' is smaller than the required distance P', light passing through one imaging pinhole 31' may be incident to a sensing area EA' corresponding to another imaging pinhole 31', resulting in the crosstalk between adjacent sensing areas EA'.

However, it is inoperable to improve the precision in fingerprint recognition by reducing the distance between adjacent imaging pinholes. To resolve the above problem and other problems, the present disclosure provides a display panel, a display apparatus and a method for fingerprint recognition. According to the present disclosure, at least two types of imaging pinholes may be arranged, and the fingerprint recognition light source corresponding to the at least two imaging pinholes may generate two types of light. Each type of imaging pinholes may only allow one type of light to pass through. During a same time period, the fingerprint recognition light source may emit one type of light and the images formed via one type of imaging pinholes may be detected. Subsequently, based upon the detected images formed via all of the imaging pinholes, the fingerprint recognition may be realized. Since a same type of imaging pinholes may not be adjacent to each other, the distance between adjacent imaging pinholes may be reduced, thereby increasing the density of imaging pinholes on the light-shielding layer and improving the precision in fingerprint recognition.

Figure 4:
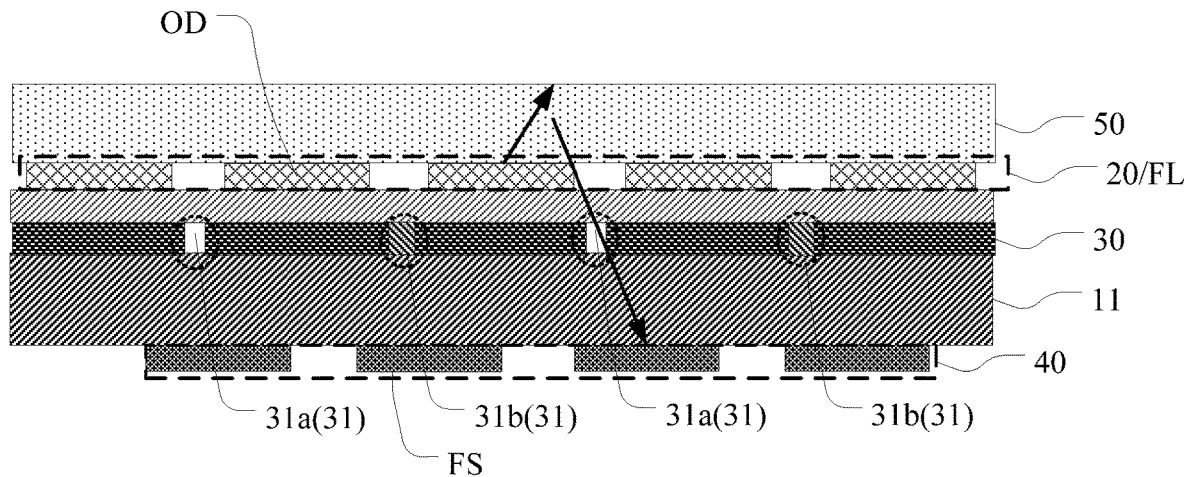
FIG. 4 illustrates a schematic diagram of film layer structures in an exemplary display panel according to various embodiments of the present disclosure.
Figure 5:
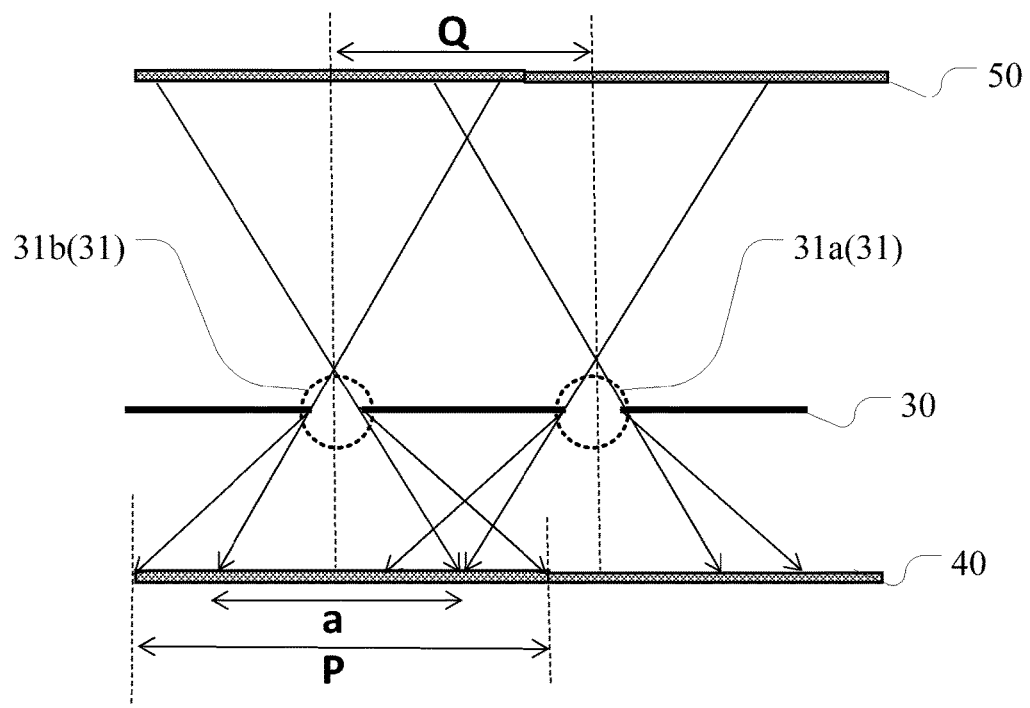
FIG. 5 illustrates a schematic diagram of imaging areas in an exemplary display panel according to various embodiments of the present disclosure.
Figure 6:
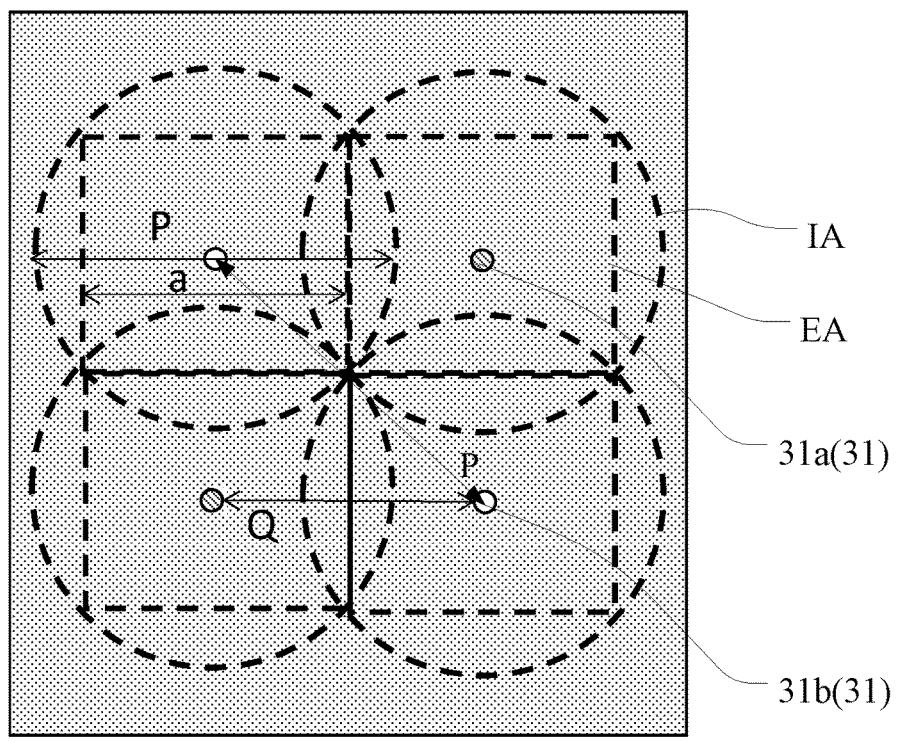
FIG. 6 illustrates a schematic diagram of imaging areas in another exemplary display panel according to various embodiments of the present disclosure.

FIG. 4 illustrates a schematic diagram of film layer structures in an exemplary display panel according to various embodiments of the present disclosure. FIG. 5 and FIG. 6 each illustrates a schematic diagram of imaging areas in an exemplary display panel according to various embodiments of the present disclosure. In one embodiment with reference to FIGS. 4-6, a cover layer 50 of the display panel may be disposed on a light-exiting surface of the display panel. When a touch-control operation is performed, a finger may touch the cover layer 50. According to the embodiment of the present disclosure, the display panel may include: a base layer 11 and a light-emitting layer 20 disposed on a side of the base layer 11, where the light-emitting layer 20 may include a plurality of light-emitting units OD. The display panel may further include a light-shielding layer 30 including a plurality of imaging pinholes 31. An orthogonal projection of the plurality of imaging pinholes 31 on the light-emitting layer 20 may be at least partially disposed between adjacent light-emitting units OD. Further, the plurality of imaging pinholes 31 may include two types of imaging pinholes, that is, a first imaging pinhole 31$a$ and a second imaging pinhole 31$b$. Alternatively, the plurality of imaging pinholes 31 may include more than two types of imaging pinholes 31. A second imaging pinhole 31$b$ may be disposed between at least two adjacent first imaging pinhole 31$a$, that is, any two adjacent imaging pinholes 31 may not be a same type of imaging pinholes 31. The display panel may further include a light-sensitive fingerprint sensor layer 40. The light-shielding layer 30 may be disposed on a side of the light-sensitive fingerprint sensor layer 40 facing towards the light-exiting surface of the display panel. The display panel may further include a fingerprint recognition light source FL which may be an independently-arranged light source, alternatively, multiplexed by the light-emitting units OD.

It should be noted that the schematic diagrams of film layer structures in the exemplary display panel with reference to FIG. 4 as well as other drawings merely illustrate relative positional relationships between each of the film layers. In other embodiments of the present disclosure, other film layers may be disposed between the illustrated film layers. Furthermore, each film layer may be a patterned structure or a whole-layer structure based upon practical functions, for which the present disclosure will not intend to limit. With respect to the different types of imaging pinholes according to the embodiments of the present disclosure with the accompanying drawings, the different types of imaging pinholes may be formed directly on the light-shielding layer. Alternatively, a same type of through holes may be formed on the light-shielding layer, where these through holes may be configured to form different types of imaging pinholes by covering different materials. The two types of imaging pinholes as showing in FIG. 4 are for illustrative purposes only, the formation and structure of which will be not limited in the present disclosure.

According to the embodiment of the present disclosure, the display panel may include the light-sensitive fingerprint sensor layer 40 and the light-shielding layer 30 including the plurality of imaging pinholes 31. When light generated by the fingerprint recognition light source FL transmits to a touch surface between the cover layer 50 and the finger, it may reflect on the touch surface. The reflected light may be incident to the light-sensitive fingerprint sensor layer 40 through the imaging pinholes 31. When the aperture of the imaging pinholes 31 is sufficiently small, the fingerprint may be imaged on the light-sensitive fingerprint sensor layer 40 based on the principle of pinhole imaging, thereby realizing the fingerprint recognition. Further, the imaging pinholes 31 may form imaging areas IA on the light-sensitive fingerprint sensor layer 40.

In particular, the plurality of imaging pinholes 31 may include first imaging pinholes 31*a* and second imaging pinholes 31*b*. Correspondingly, the fingerprint recognition light source FL may generate two types of light including first light and second light, corresponding with the first imaging pinhole 31*a* and the second imaging pinholes 31*b*, respectively. Their characteristics may be as follows: the first light may pass through the first imaging pinholes 31*a* and the second imaging pinholes 31*b* may not allow the first light to pass through, while the second light may pass through the second imaging pinholes 31*b* and the first imaging pinholes 31*a* may not allow the second light to pass through. That is, the first imaging pinholes 31*a* may allow the first light to pass through, and block the second light, while the second imaging pinholes 31*b* may allow the second light to pass through, and block the first light.

During the disclosed fingerprint recognition process, a fingerprint recognition cycle may include a first time period and a second time period. During the first time period, the fingerprint recognition light source FL may generate the first light, which may pass through the first imaging pinholes 31*a* while being blocked by the second imaging pinhole 31*b*. Meanwhile, the image formed in an imaging area IA on the light-sensitive fingerprint sensor layer 40 corresponding to the first imaging pinholes 31*a* may be detected. During the second time period, the fingerprint recognition light source FL may generate the second light, which may pass through the second imaging pinhole 31*b* while being blocked by the first imaging pinhole 31*a*. Meanwhile, the image formed in an imaging area IA on the light-sensitive fingerprint sensor layer 40 corresponding to the second imaging pinholes 31*b* may be detected. Subsequently, the two detected images may be overlapped, thereby realizing the fingerprint recognition.

When the plurality of imaging pinholes 31 includes three or more types of imaging pinholes 31, the fingerprint recognition light source FL may correspondingly generate three or more types of light, such that each type of imaging pinholes 31 may only allow one type of light to pass through while blocking other types of light. During the disclosed fingerprint recognition process, a fingerprint recognition cycle may include three or more of time periods. In each time period, the fingerprint recognition light source FL may only emit one type of light, such that an image formed in an imaging area IA on the light-sensitive fingerprint sensor layer 40 corresponding to one type of imaging pinholes 31 may be detected. Subsequently, all of the detected images may be overlapped, thereby realizing the fingerprint recognition.

Based upon the structures of the display panel and the fingerprint recognition process in accordance with the embodiments of the present disclosure, during the first time period or the second time period, adjacent imaging pinholes 31 may not be a same type of imaging pinholes 31. As such, the crosstalk between adjacent imaging pinholes 31 may be avoided, and it may only need to be ensured the crosstalk between the same type of imaging pinholes being avoided. With reference to FIGS. 5-6, it may only need to avoid light transmitted out of a first imaging pinhole 31*a* located on a diagonal line from being incident to an effective sensing area EA corresponding to another first imaging pinhole 31*a* located on the diagonal line. As such, a distance Q between two adjacent imaging pinholes 31 may be greater than P (Q>P). That is, based upon the structures of the display panel and the fingerprint recognition process according to the embodiments of the present disclosure, the distance between two adjacent imaging pinholes 31 may further be reduced.

Based on the assumption that the imaging pinholes having equivalent imaging areas IA, that is P=P', the embodiments of the present disclosure may be compared with the display panel shown in FIGS. 1-3. Since the distance between adjacent imaging pinholes 31 may be further reduced, e.g., from P to Q, the size of an effective sensing area EA corresponding to the imaging pinholes 31 may also be reduced. For example, the area may be reduced from a circumscribed square of an imaging area IA where the circumscribed square may have a side length of P, to an inscribed square of an imaging area IA where the inscribed square may have a side length of a. As such, the probabilities of uneven brightness and image distortion at edge positions of the effective sensing area EA may be significantly reduced, thereby increasing the precision in fingerprint recognition. That is, adjacent imaging pinholes may be the different types of imaging pinholes, and the imaging areas IA corresponding to the adjacent different types of imaging pinholes 31 may be overlapped. As such, the distance between adjacent imaging pinholes 31 may be reduced, thereby increasing the density of the imaging pinholes 31 and improving the imaging precision. Furthermore, since adjacent imaging pinholes 31 are different types of imaging pinholes, even if the imaging areas IA corresponding to the adjacent imaging pinholes were overlapped, such overlapping may not have influence in the adjacent imaging pinholes. Even in the existence of an alignment error due to the limitation in the manufacture process, the crosstalk between adjacent imaging pinholes may still be prevented. Additionally, it may prevent light passing through one imaging pinhole from affecting an image formed by another imaging pinhole due to small distance between two imaging pinholes.

According to the embodiments of the present disclosure, the display panel may include at least two types of imaging pinholes, and the imaging pinholes having a same type may not be adjacent to each other. Further, at least two types of light may be arranged corresponding to the at least two types of imaging pinholes, such that each type of imaging pinholes may only allow one type of light to pass through, while blocking all other types of light. During the fingerprint recognition process, a fingerprint recognition cycle may include at least a first time period and a second time period. In each time period, the fingerprint recognition light source FL may only emit one type of light, such that an image formed in an imaging area IA on the light-sensitive fingerprint sensor layer 40 corresponding to one type of imaging pinholes 31 may be detected. Subsequently, all of the detected images may be superimposed, thereby realizing the fingerprint recognition. The exemplary fingerprint recognition according to the embodiments of the present disclosure may be easy to control. Further, based upon the realization of fingerprint recognition, the distance between imaging pinholes may be reduced, that is, the density of the imaging pinholes may be increased and the size of the imaging area corresponding to each of the imaging pinholes may be regarded as being reduced. As such, the probabilities of uneven brightness and image distortion at edge positions of conventional effective sensing area may be significantly reduced, thereby increasing the precision in fingerprint recognition.

As disclosed herein, an "imaging area" refers to an area of an image that an imaging pinhole can form on the light-sensitive fingerprint sensor layer. Often, edge portions of the formed image of a corresponding imaging pinhole on the light-sensitive fingerprint sensor layer may be unclear or distorted, which may cause the image cannot be entirely read or recognized. Light-sensitive fingerprint sensor(s) corresponding to the imaging pinhole may no longer read such edge portions of the imaging area. An "effective sensing area" thus refers to a portion of the "imaging area" that the light-sensitive fingerprint sensor(s) actually read the image thereof.

Optionally in one embodiment with reference to FIG. 4, the light-shielding layer 30 may be disposed between the base layer 11 and the light-emitting layer 20. That is, the light-shielding layer 30 may be disposed on a side of the light-emitting layer 20 facing towards the based substrate 11, thereby avoiding any influence of the light-shielding layer 30 on the light emitting of the display panel.

Figure 7:
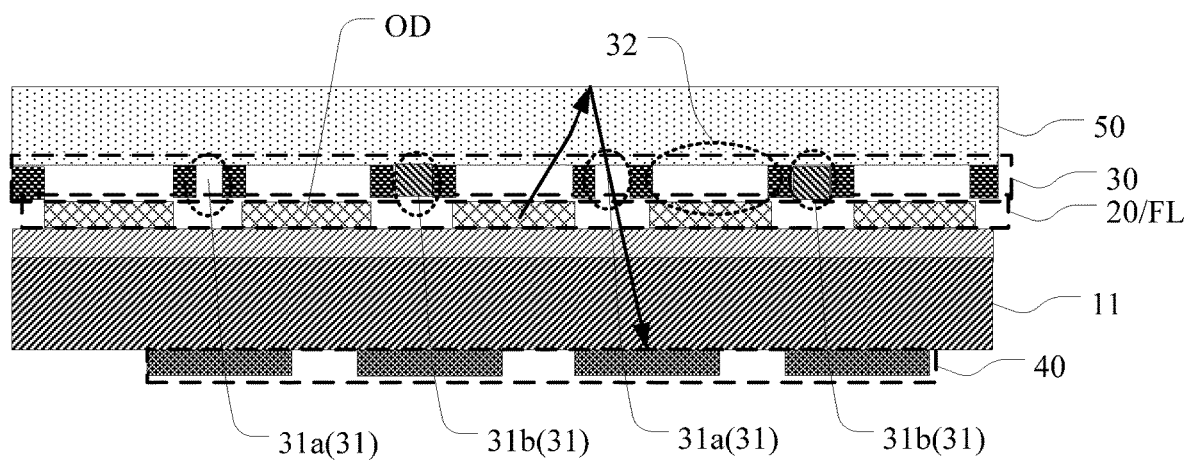
FIG. 7 illustrates a schematic diagram of film layer structures in another exemplary display panel according to various embodiments of the present disclosure.

FIG. 7 illustrates a schematic diagram of film layer structures in another exemplary display panel according to various embodiments of the present disclosure. In one embodiment with reference to FIG. 7, the light-shielding layer 30 may be disposed on a side of the light-emitting layer 20 away from the based substrate 11. Accordingly, pixel holes 32 may be arranged on the light-shielding layer 30, where the pixel holes 32 may correspond to light-emitting units OD. As such, light generated by the light-emitting units OD may exit from the pixel holes 32.

With reference to FIG. 4 and FIG. 7, no matter which side of light-emitting layer 20 the light-shielding layer 30 was disposed on, the light-sensitive fingerprint sensor layer 40 may be disposed on a side of the light-shielding layer 30 away from the light-exiting surface of the display panel, that is, on a side of the light-shielding layer 30 away from the cover layer 50. As such, it may be ensured that light reflected from the touch surface between the finger and the cover layer 50 may pass through the imaging pinholes 31, and further be incident to the light-sensitive fingerprint sensor layer 40. Additionally, to realize the pinhole imaging, it may be required to keep certain distance between the light-shielding layer 30 and the light-sensitive fingerprint sensor layer 40, along a direction corresponding to the thickness of the display panel. Accordingly, in one embodiment of the present disclosure, the light-sensitive fingerprint sensor layer 40 may be disposed on a side of the base layer 11 away from the light-emitting layer 20.

According to the aforementioned embodiment of the present disclosure where the light-sensitive fingerprint sensor layer 40 may be disposed on a side of the base layer 11 away from the light-shielding layer 30, at least the base layer 11 may be disposed between the light-sensitive fingerprint sensor layer 40 and the light-shielding layer 30. For a rigid display panel, the base layer 11 may be a glass substrate which may satisfy the distance requirement between the light-shielding layer 30 and the light-sensitive fingerprint sensor layer 40. As such, it may not need additional film layers to satisfy the distance requirement between the light-shielding layer 30 and the light-sensitive fingerprint sensor layer 40. Additionally, it may make the display panel thin and light, by avoiding increasing the thickness of the display panel.

Figure 8:
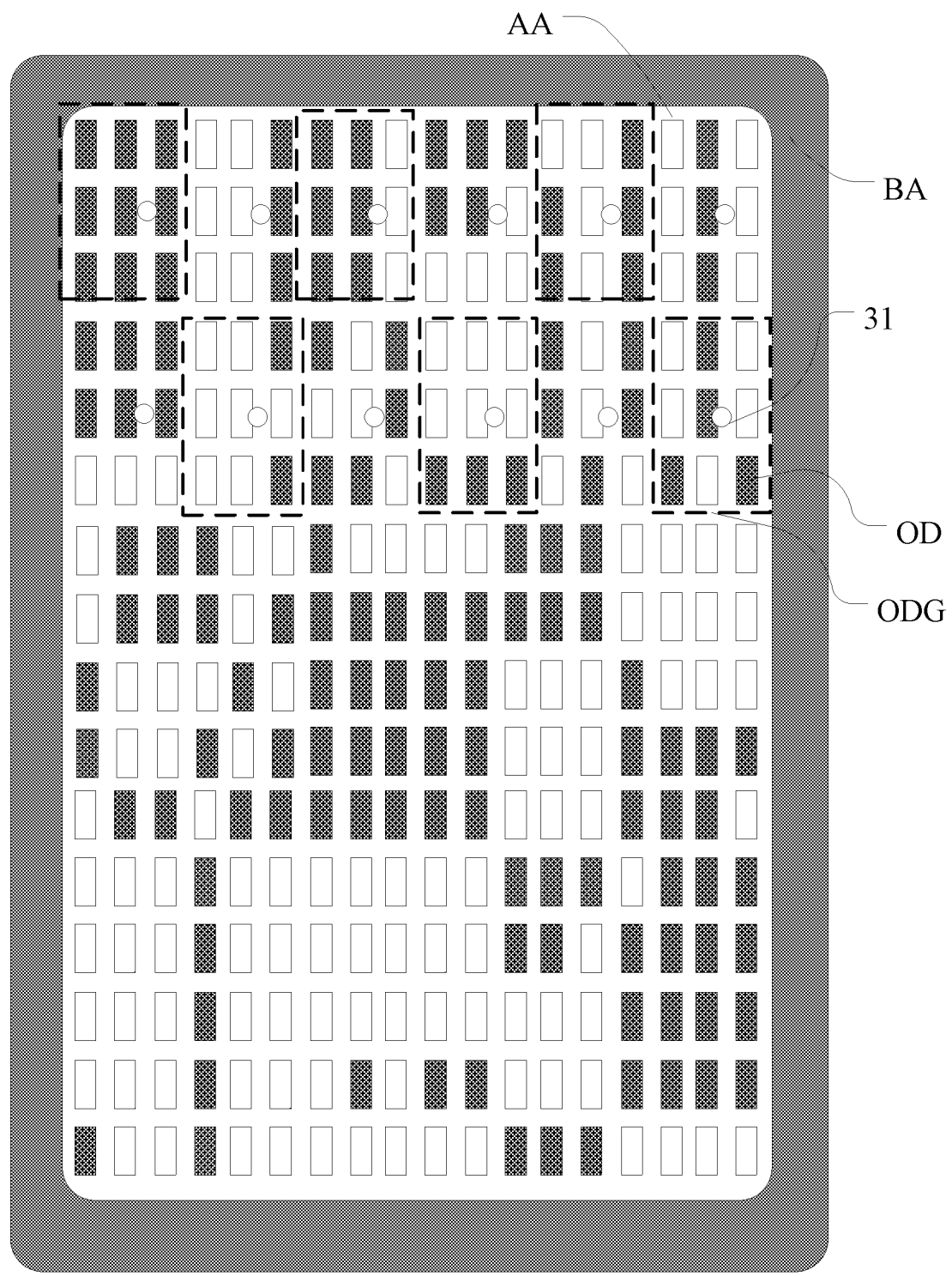
FIG. 8 illustrates a top view of an exemplary display panel according to various embodiments of the present disclosure.

According to the embodiments of the present disclosure, the arrangements of the imaging pinholes may be referring to the arrangements of the light-emitting units. FIG. 8 illustrates a top view of an exemplary display panel according to various embodiments of the present disclosure. In one embodiment with reference to FIG. 8, the display panel may include a display area AA and a border area surrounding the display area AA. The light-emitting units OD may be disposed in the display area AA. The display panel may be a regular display panel and correspondingly, the display area AA may be a regular display region having a rectangular shape. Alternatively, the display panel may be an irregular display panel having a circular shape or a ring shape. Optionally, a transparent area may be arranged on the display panel, where the earpiece and camera module may be disposed. Further, a notch recessed into the display area may be disposed at an edge position of the display panel, or a corner of the display panel may have an arc shape. Regardless what shape or structure the disclosed display panel may have, all of the light-emitting units OD in the display area AA may be arranged into a plurality of light-emitting unit groups ODG, and each light-emitting unit group ODG may include a plurality of light-emitting units OD. When arranging the imaging pinholes 31, each light-emitting unit group ODG may correspond to one of the imaging pinhole 31.

According to the embodiments of the present disclosure, each light-emitting unit group ODG may correspond to an imaging pinhole 31, such that the imaging pinholes may be regularly arranged on the display panel.

Figure 9:
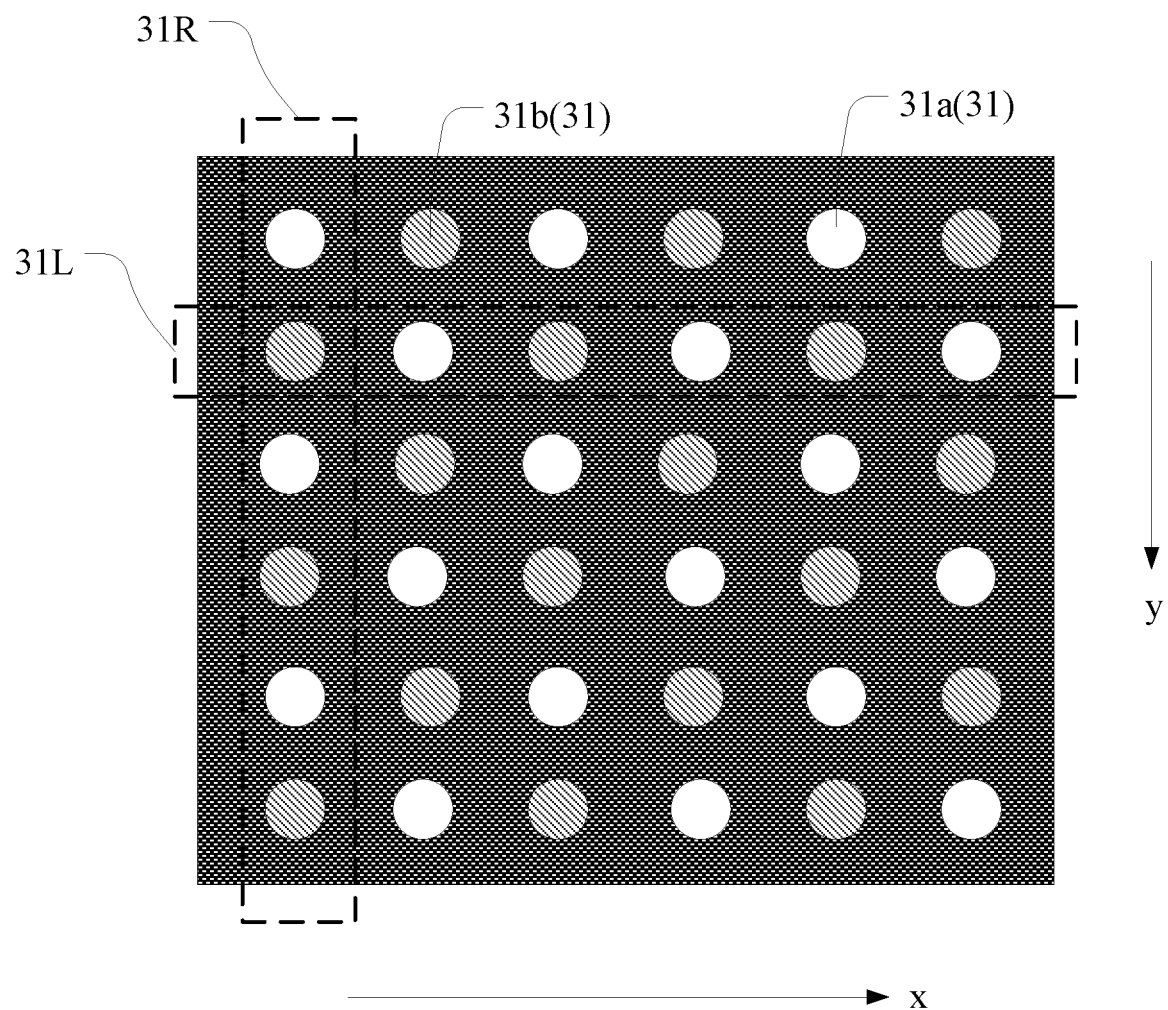
FIG. 9 illustrates a schematic diagram of imaging pinholes in an exemplary display panel according to various embodiments of the present disclosure.

With respect to the detailed arrangement of the imaging pinholes, FIG. 9 illustrates a schematic diagram of imaging pinholes in an exemplary display panel according to various embodiments of the present disclosure. In one embodiment with reference to FIG. 9, a plurality of imaging pinholes may be sequentially arranged, along a first direction x, to form a plurality of rows of imaging pinholes 31L. Further, the plurality of imaging pinholes may be sequentially arranged, along a second direction y, to form a plurality of columns of imaging pinholes 31R. The first direction x may intersect the second direction y, and the first imaging pinhole 31a and the second imaging pinhole 31b may be alternatively arranged along the first direction x and the second direction y.

According to the embodiments of the present disclosure, the imaging pinholes on the light-shielding layer may be regularly arranged in a simple manner. Further, during the formation of the imaging pinholes, it may only need a simplified manufacture process.

Figure 10:
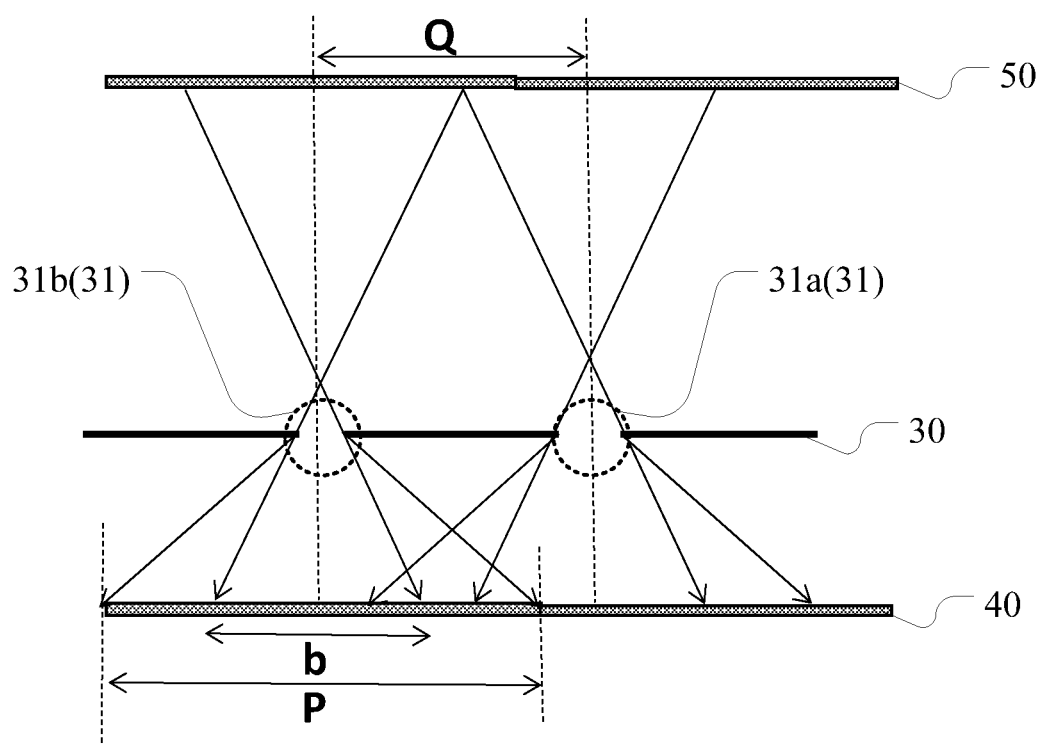
FIG. 10 illustrates a schematic diagram of imaging areas in another exemplary display panel according to various embodiments of the present disclosure.
Figure 11:
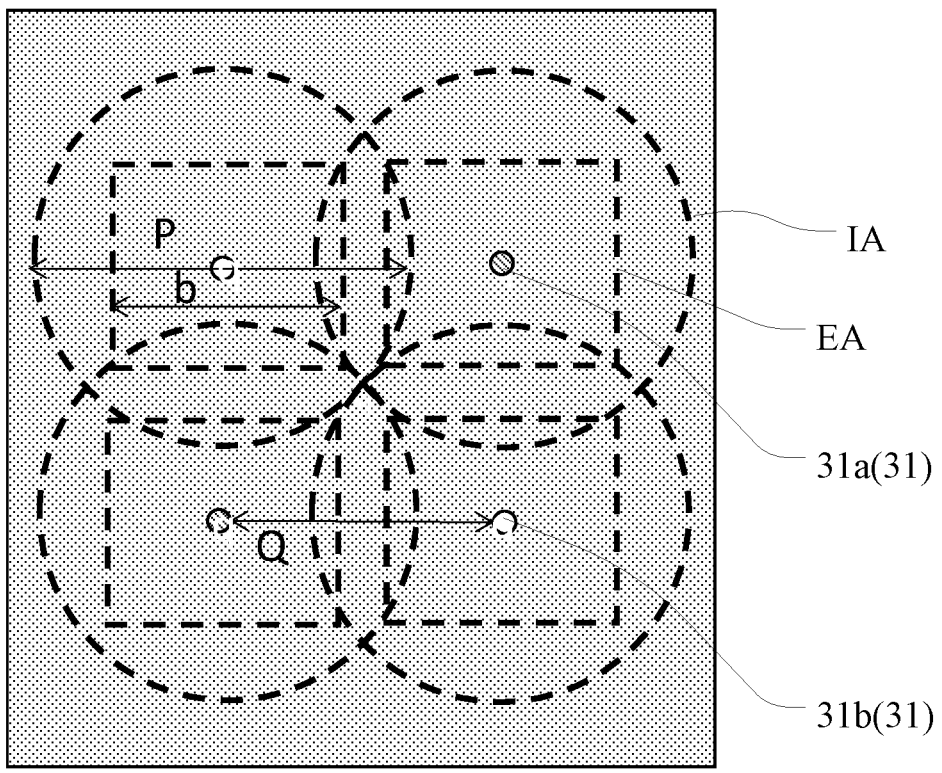
FIG. 11 illustrates a schematic diagram of imaging areas in another exemplary display panel according to various embodiments of the present disclosure.

FIG. 10 and FIG. 11 each illustrates a schematic diagram of imaging areas of an exemplary display panel according to various embodiments of the present disclosure. In embodiments with reference to FIGS. 5-6 and FIGS. 10-11, a first imaging pinhole 31a and a second imaging pinhole 31b may be adjacent to each other. That is, for adjacent imaging pinholes having different types, an imaging area IA on the light-sensitive fingerprint sensor layer 40 corresponding to one imaging pinhole 31 may be overlapped with an imaging area IA on the light-sensitive fingerprint sensor layer 40 corresponding to the adjacent imaging pinhole 31. As such, the distance between adjacent imaging pinholes may be reduced. Further, an effective sensing area EA may be disposed corresponding to an imaging area IA of each imaging pinhole 31. A maximum size of the effective sensing area EA may be a square region with a side length of a. With reference to FIGS. 5-6, the effective sensing area EA may be an inscribed square of the imaging area IA. With further reference to FIGS. 10-11, a minimum size of the effective sensing area EA may be a square region with a side length of b. That is, the boundaries of the fingerprint images detected by all of the effective sensing areas EA may be connected. As such, all of the effective sensing areas EA may recognize a complete fingerprint image appropriately. On one side, it may avoid the image of the fingerprint at a same position from being detected by two of the effective sensing areas EA, resulting in the redundancy in fingerprint recognition. On the other, it may avoid the image of the fingerprint at a certain position from being missed by all of the effective sensing areas EA, resulting in the reduced precision in fingerprint recognition. Optionally, the imaging area IA on the light-sensitive fingerprint sensor layer 40 corresponding to the imaging pinhole 31 may have a geometric center, and the effective sensing area EA corresponding to the imagine pinhole 31 may also have a geometric center. A projection of the geometric center of the imaging area IA on the base layer may be overlapped with a projection of the geometric center of the effective sensing area EA on the base layer.

In various embodiments of the present disclosure, for any two first imaging pinholes 31a, an imaging area IA on the light-sensitive fingerprint sensor layer 40 corresponding to one of the any two first imaging pinhole 31a may not be overlapped with an effective sensing area EA on the light-sensitive fingerprint sensor layer 40 corresponding to another one of the any two first imaging pinhole 31a. That is, the crosstalk between the effective sensing areas EA corresponding to the any two first imaging pinholes 31a may be avoided. For any two second imaging pinholes 31b, an imaging area IA on the light-sensitive fingerprint sensor layer 40 corresponding to one of the any two second imaging pinhole 31b may not be overlapped with an effective sensing area EA on the light-sensitive fingerprint sensor layer 40 corresponding to another one of the any two second imaging pinhole 31b. As such, the crosstalk between any two imaging pinholes may be avoided even if the distance between adjacent imaging pinholes is reduced. Optionally, an imaging range corresponding to the first imaging pinhole 31a may be overlapped with the effective sensing area EA on the light-sensitive fingerprint sensor layer 40 corresponding to the second imaging pinhole 31b. That is, the effective sensing area EA on the light-sensitive fingerprint sensor layer 40 corresponding to the first imaging pinhole 31a, may be overlapped with the effective sensing area EA on the light-sensitive fingerprint sensor layer 40 corresponding to the second imaging pinhole 31b. Compared with existing display panels, in the display panel according to the embodiments of the present disclosure, the imaging areas corresponding to adjacent imaging pinholes may be overlapped with each other, thereby increasing the density of the imaging pinholes in the display panel and improving the precision in fingerprint recognition. Furthermore, for any two imaging pinholes having a same type, the imaging area corresponding to one imaging pinhole may not be overlapped with the effective sensing area corresponding to another imaging pinhole. That is, for each of the imaging pinholes, an image formed by this imaging pinhole may not fall within the effective sensing area corresponding to another imaging pinhole, thereby avoiding the crosstalk between adjacent imaging pinholes. According to the embodiment of the present disclosure, the size of the effective sensing area corresponding to each imaging pinhole may be reduced to a certain range, such that the effective sensing areas may recognize a complete image of a fingerprint, thereby fulfilling the requirement for fingerprint recognition. Additionally, it may further reduce the probabilities of uneven brightness and distortion at edge positions of the sensing areas, thereby further improving the precision in fingerprint recognition.

Figure 12:
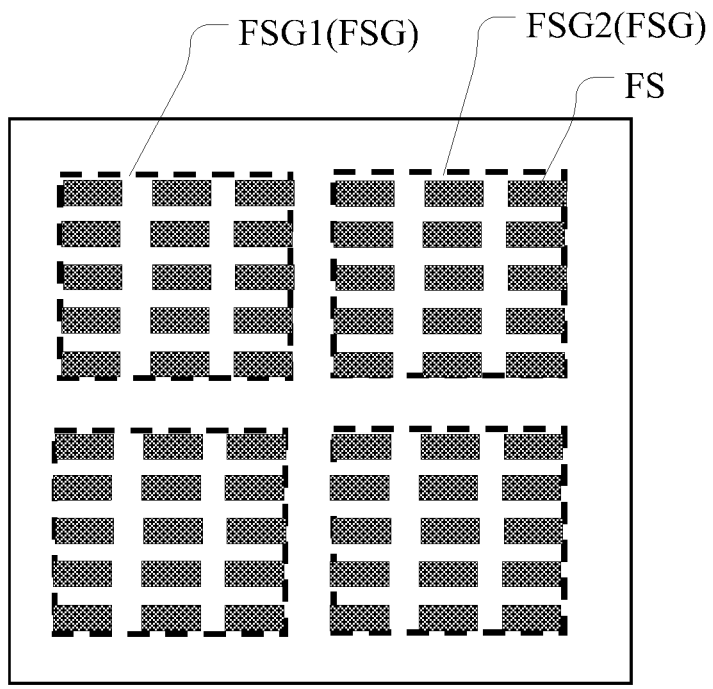
FIG. 12 illustrates a schematic diagram of a light-sensitive fingerprint sensor layer in an exemplary display panel according to various embodiments of the present disclosure.

FIG. 12 illustrates a schematic diagram of a light-sensitive fingerprint sensor layer in an exemplary display panel according to various embodiments of the present disclosure. In one embodiment with reference to FIGS. 10-12, the light-sensitive fingerprint sensor layer may include a plurality of light-sensitive fingerprint sensor groups FSG, and each of the light-sensitive fingerprint sensor groups FSG may include a plurality of light-sensitive fingerprint sensors FS. For each of the imaging pinholes 31, its corresponding effective sensing area EA on the light-sensitive fingerprint sensor layer 40 may correspond to one of the light-sensitive fingerprint sensor groups FSG. For example, the first imaging pinhole 31a may have an effective sensing area EA on the light-sensitive fingerprint sensor layer 40, corresponding to a first light-sensitive fingerprint sensor group FSG1, and the second imaging pinhole 31b may have an effective sensing area EA on the light-sensitive fingerprint sensor layer 40, corresponding to a second light-sensitive fingerprint sensor group FSG2.

According to the embodiments of the present disclosure, the imaging pinholes may have effective sensing areas corresponding to light-sensitive fingerprint sensor groups including a plurality of light-sensitive fingerprint sensors. As such, the redundancy in the arrangements of the light-sensitive fingerprint sensors may be avoided. Furthermore, when reading out an image of a fingerprint, all of the first light-sensitive fingerprint sensor groups FSG1 may detect during the first time period, and a fingerprint recognition chip may read out the information from all of the first light-sensitive fingerprint sensor groups FSG1. During the second time period, all of the second light-sensitive fingerprint sensor groups FSG2 may detect, and the fingerprint recognition chip may read out the information from all of the second light-sensitive fingerprint sensor groups FSG2. As such, the fingerprint recognition chip may only require a simple processing logic.

Figure 13:
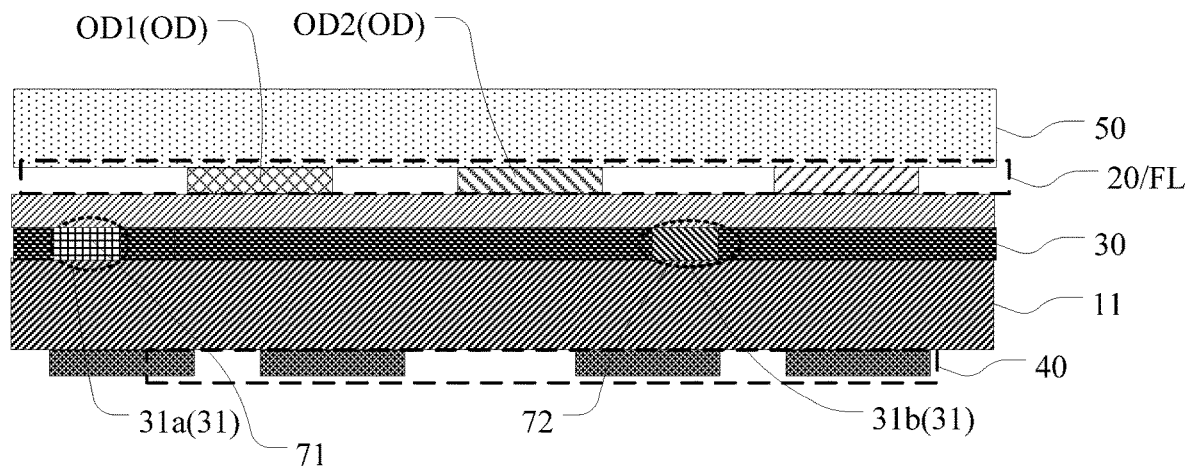
FIG. 13 illustrates a schematic diagram of film layer structures in another exemplary display panel according to various embodiments of the present disclosure.

FIG. 13 illustrates a schematic diagram of film layer structures in another exemplary display panel according to various embodiments of the present disclosure. In the embodiment with reference to FIG. 13, the first light and the second light may have different colors. The display panel may further include a first color filter 71 and a second color filter 72. The first color filter 71 may have a same color as the first light, and the first color filter 71 may cover the first imaging pinhole 31a, such that the first light may pass through the first imaging pinhole 31a. Further, the second color filter 72 may have a same color as the second light, and the second color filter 72 may cover the second imaging pinhole 31b, such that the second light may pass through the second imaging pinhole 31b.

According to the embodiments of the present disclosure, the first light and the second light may have different colors, and the first and second color filters may cover the first and second imaging pinholes, where the covering color filters may correspond to light having the same color. By utilizing simple arrangements between light and color filters as well as the simple structures, it may realize a corresponding relationship between light and the imaging pinholes, thereby improving the precision in fingerprint recognition. In addition, since each of the imaging pinholes may only allow light with a color corresponding to this imaging pinhole to pass through, it may reduce the influence of light with other colors on the fingerprint recognition.

The wavelengths of light with different colors may have overlaps. To prevent light leakage from imaging pinholes and potential crosstalk, as well as to further improve the precision in the detection, optionally, the light-sensitive fingerprint sensors corresponding to the first imaging pinholes may function when the first light emits, while the light-sensitive fingerprint sensors corresponding to the second imaging pinholes may stop functioning. Similarly, when the second light emits, the light-sensitive fingerprint sensors corresponding to the second imaging pinholes may function, while the light-sensitive fingerprint sensors corresponding to the first imaging pinholes may stop functioning. As such, the light-sensitive fingerprint sensors may be avoided from detecting light with non-corresponding color.

In another embodiment of the present disclosure with further reference to FIG. 13, the first color filter 71 may be a red color filter and the second color filter may be a green color filter. The first light may be red light and the second light may be green light. By utilizing the red and green color filters as well as red and green light, the first imaging pinholes may allow red light to pass through while blocking green light, and the second imaging pinholes may allow green light to pass through while blocking red light.

In another embodiment of the present disclosure with further reference to FIG. 13, the first color filter 71 and the second color filter 72 may be disposed on a same layer as the light-shielding layer 30, which may reduce the thickness of the display panel. Alternatively, the first color filter 71 and the second color filter 72 may be disposed between the light-shielding layer 30 and the cover layer 50.

For the fingerprint recognition light source which may generate light with different colors, it may be an external light source. Alternatively, in one embodiment with reference to FIG. 13, the light-emitting layer 20 may be multiplexed as the fingerprint recognition light source FL. With respect to a color display panel, the light-emitting layer 20 may include a light-emitting unit OD configured to generate the first light, and a light-emitting unit OD configured to generate the second light. For example, the light-emitting layer 20 may include a light-emitting unit OD1 configured to generate red light and a light-emitting unit OD2 configured to generate green light. During the first time period, the light-emitting unit OD1 configured to generate the first light may be illuminated, and during the second time period, the light-emitting unit OD2 configured to generate the second light may be illuminated. By multiplexing the light-emitting layer 20 as the fingerprint recognition light source FL, it may fulfill the requirement of generating light with different colors by the fingerprint recognition light source FL, without arranging additional light sources. Further, by utilizing the control circuit for controlling all of the light-emitting units in the light-emitting layer 20 during an image display process, the light-emitting units may be illuminated to emit light with corresponding colors during different time periods without arranging additional control circuits, which may be cost-effective.

Figure 14:
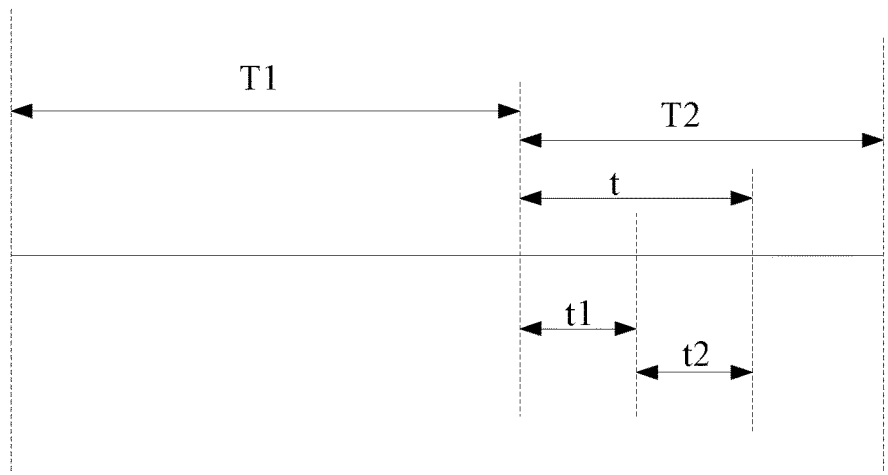
FIG. 14 illustrates a timing diagram of an exemplary display panel according to various embodiments of the present disclosure.

FIG. 14 illustrates a timing diagram of an exemplary display panel according to various embodiments of the present disclosure. In one embodiment with reference to FIGS. 13-14, the display panel may include a display period T1 and a fingerprint detection period t. During the display period T1, the light-emitting units OD may display corresponding images. The finger detection period t, within a touch period T2, may include a first time period t1 and a second time period t2. In particular, during the first time period t1, the light-emitting units OD within the touch area may emit the first light, for example, the light-emitting units OD1 within the touch area may be illuminated to emit red light. During the second time period t2, the light-emitting units OD within the touch area may emit the second light, for example, the light-emitting units OD2 within the touch area may be illuminated to emit green light.

Figure 15:
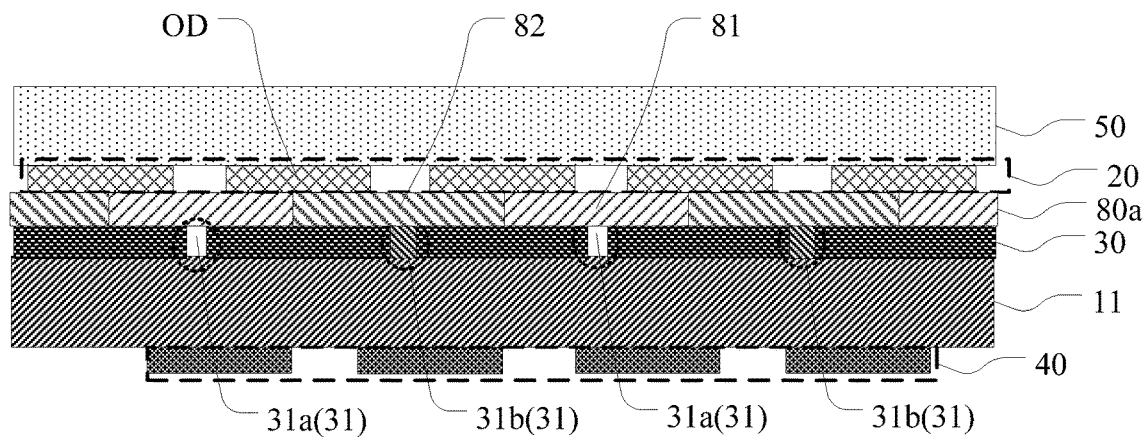
FIG. 15 illustrates a schematic diagram of film layer structures in another exemplary display panel according to various embodiments of the present disclosure.
Figure 16:
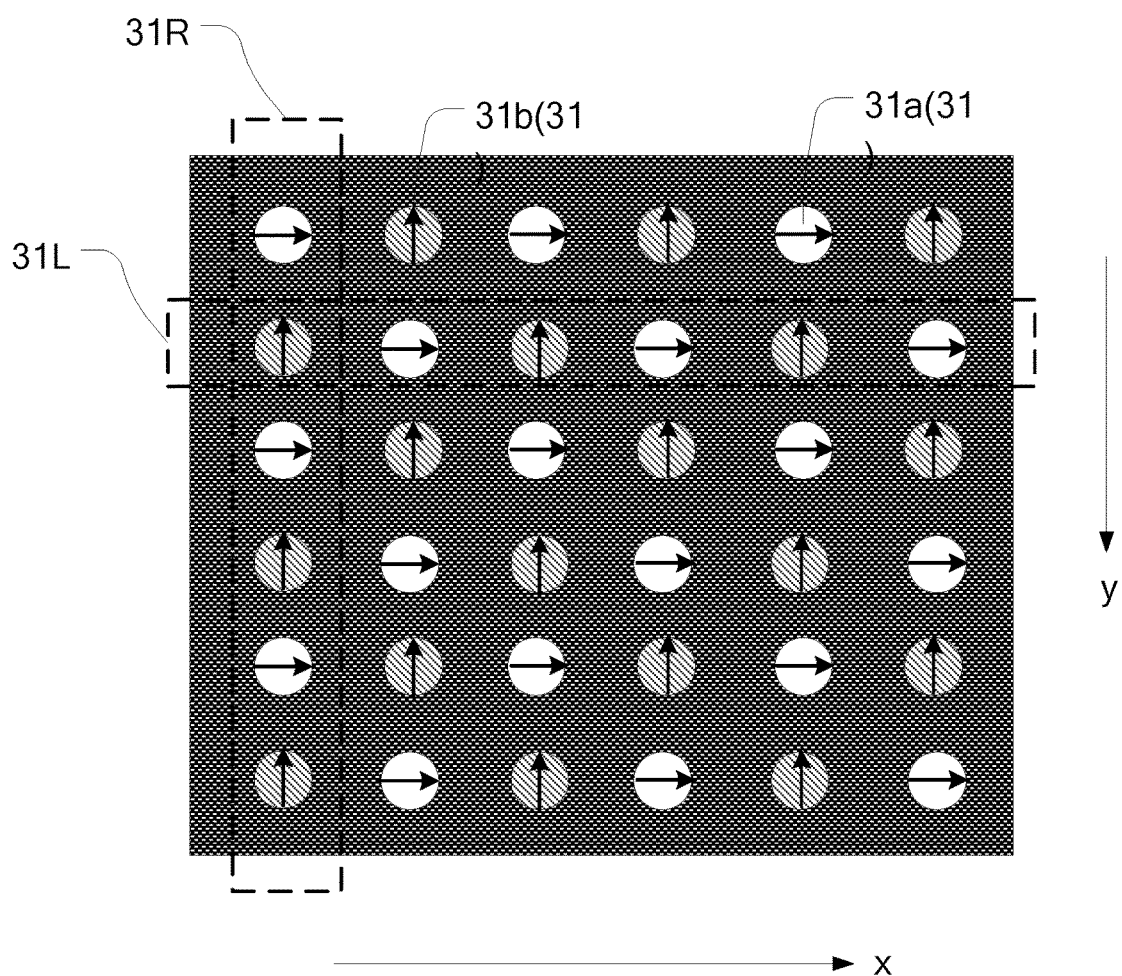
FIG. 16 illustrates a schematic diagram of imaging pinholes in another exemplary display panel according to various embodiments of the present disclosure.

FIG. 15 illustrates a schematic diagram of film layer structures in another exemplary display panel according to various embodiments of the present disclosure. FIG. 16 illustrates a schematic diagram of imaging pinholes in another exemplary display panel according to various embodiments of the present disclosure. In one embodiment with reference to FIGS. 15-16, a polarization direction of the first light may be perpendicular to a polarization direction of the second light. For example, the arrows as shown in FIG. 16 may be polarization directions of light. The display panel according to the embodiment may further include a first polarization area 81 and a second polarization area 82. A polarization axis of the first polarization area 81 may have a same direction as the polarization direction of the first light, and the first polarization area 81 may cover the first imaging pinhole 31a, such that the first light may pass through the first imaging pinhole 31a. Further, a polarization axis of the second polarization area 81 may have a same direction as the polarization direction of the second light, and the second polarization area 82 may cover the second imaging pinhole 31b, such that the second light may pass through the second imaging pinhole 31b.

According to the aforementioned embodiments of the present disclosure, a polarization direction of the first light may be perpendicular to a polarization direction of the second light. Further, the first imaging pinholes and the second pinholes may be covered by the polarization areas having a same polarization direction as the corresponding light, respectively. By utilizing the arrangements between light and corresponding polarization areas as well as their simple structures, it may realize corresponding relationships between light and the imaging pinholes, thereby improving the precision in fingerprint recognition. Further, the imaging pinholes may only allow the transmission of light having a corresponding polarization direction, and reducing the influence of light having other directions on the fingerprint recognition.

The first polarization area and the second polarization area may be realized by orienting anistropic absorbing material layers. Alternatively, the polarization areas may be realized via diffraction grating structures. For example, in one embodiment with further reference to FIG. 15, the first polarization area 81 and the second polarization area 82 may be realized by the use of anistropic absorbing material layers. The first polarization area 81 and the second polarization area 82 may be disposed on a same anistropic absorbing material layer 80a. Different positions of the anistropic absorbing material layer 80a may be oriented for different directions, to realize the arrangement of the first polarization area 81 and the second polarization area 82 on the same layer. As such, the thickness of the display panel may be reduced.

Further, in an optional embodiment of the present disclosure, the anistropic absorbing material layer 80a may be realized by a liquid crystal material layer. The liquid crystal material layer may have a first orientation at the first polarization area 81 and a second orientation at the second polarization area 82, and the second orientation may be perpendicular to the first orientation.

Figure 17:
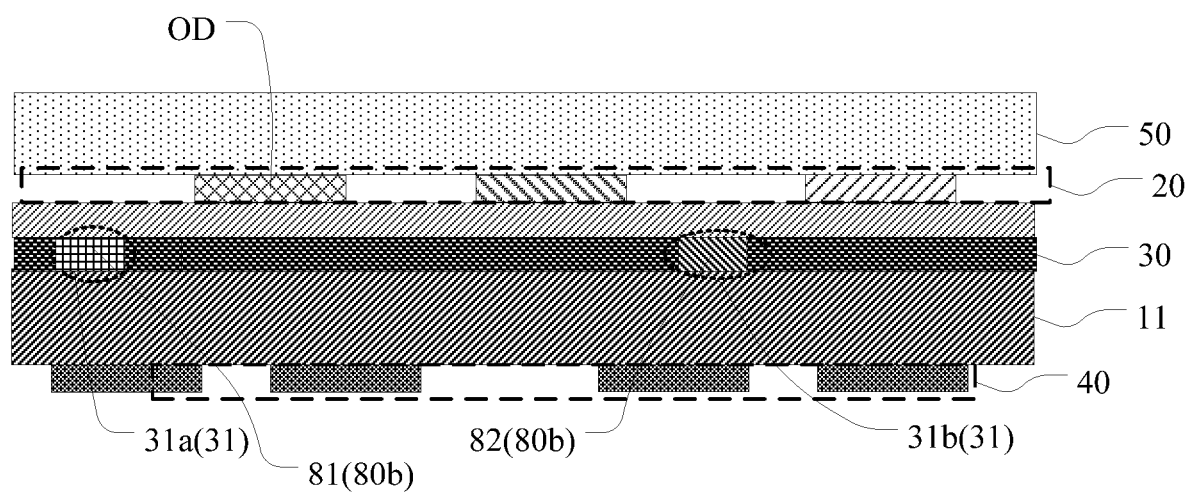
FIG. 17 illustrates a schematic diagram of film layer structures in another exemplary display panel according to various embodiments of the present disclosure.

FIG. 17 illustrates a schematic diagram of film layer structures in another exemplary display panel according to various embodiments of the present disclosure. In one embodiment of the present disclosure, the first polarization area 81 and the second polarization area 82 may be realized by the use of a diffracting grating structure. Further, the first polarization area 81 and the second polarization area 82 may be disposed on a same metallic polarization diffraction grating layer 80*b*. As such, the first polarization area 81 and the second polarization area 82 may be disposed on a same layer, reducing the thickness of the display panel.

In one optional embodiment with further reference to FIG. 17, the metallic polarization diffraction grating layer 80*b* may be disposed on a same layer as the light-shielding layer 30. In particular, the light-shielding layer 30 may be made of metallic material. A diffraction grating structure having a first polarization direction may be formed by etching at the position of the first imaging pinhole 31*a*, and a diffraction grating structure having a second polarization direction may be formed by etching at the position of the second imaging pinhole 31*b*. As such, the imaging pinholes may be formed concurrent with the manufacturing of diffraction grating structures.

According to the aforementioned embodiments of the present disclosure, the first and second polarization areas as well as the light-shielding layer may be disposed on a same layer, further reducing the thickness of the display panel. Additionally, the formation of imaging pinholes may be concurrent with the manufacturing of diffraction grating structures, thereby simplifying manufacture process and reducing cost.

Figure 18:
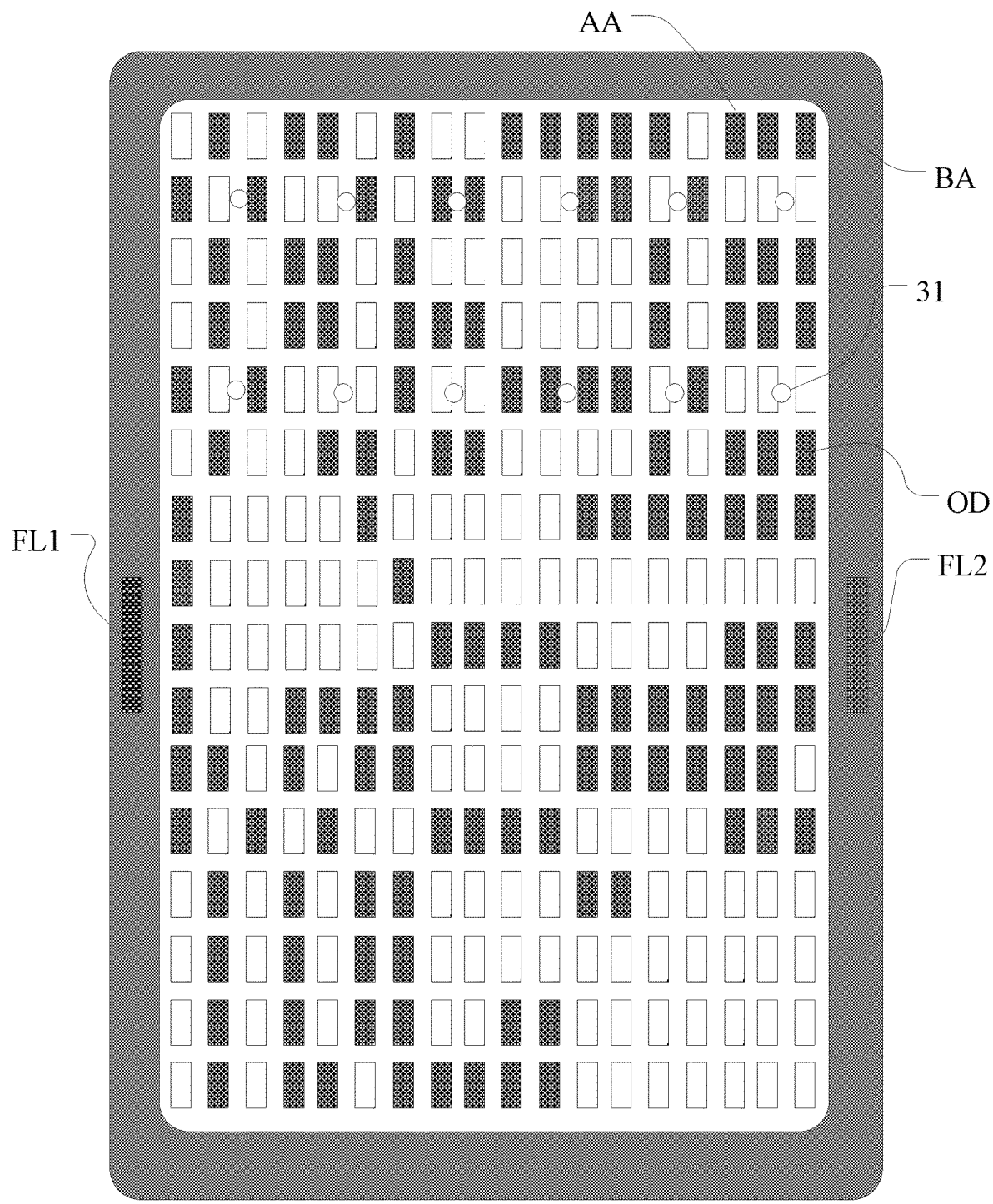
FIG. 18 illustrates a top view of another exemplary display panel according to various embodiments of the present disclosure.

For the fingerprint recognition light source which may generate light with different colors, it may be the light emitting layer, where the light emitting units of the light emitting layer corresponding to position of the imaging pinholes may fulfill the requirement for polarizing light. Alternatively, the fingerprint recognition light source may be an external light source. FIG. 18 illustrates a top view of another exemplary display panel according to various embodiments of the present disclosure. In one embodiment with reference to FIG. 18, the fingerprint recognition light source may be an external light source. Compared with the aforementioned embodiments where the light-emitting layer was multiplexed as the fingerprint recognition light source, the external light source may simplify the manufacture process. For example, the fingerprint recognition light source FL may include a first light source FL1 and a second light source FL2, where the first light source FL1 may be configured to generate the first light and the second light source FL2 may be configured to generate the second light. Both of the first light source FL1 and the second light source FL2 may be disposed in a border area BA of the display panel. Further, the fingerprint recognition light source FL may only emit light during the time period for fingerprint recognition.

Various embodiments provide a display panel for fingerprint recognition. Further, the present disclosure also provides a method for fingerprint recognition applicable to a display panel, where the method may be applied to any of the display panels according to the aforementioned embodiments and may have beneficial effects corresponding to the described display panels. The detailed structures of the display panel used in the method and beneficial effects will not be repeated herein.

Figure 19:
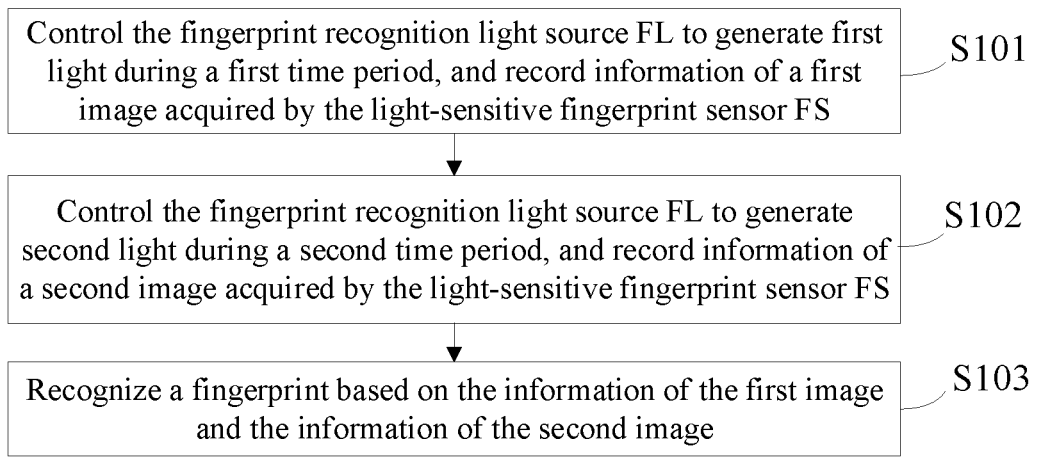
FIG. 19 illustrates a flow chat of an exemplary method for fingerprint recognition applicable to a display panel according to various embodiments of the present disclosure.

FIG. 19 illustrates a flow chat of an exemplary method for fingerprint recognition applicable to a display panel according to various embodiments of the present disclosure. In one embodiment with reference to FIG. 4 and FIG. 19, the display panel may include a light-sensitive fingerprint sensor FS, a fingerprint recognition light source FL and a plurality of imaging pinholes 31, where the plurality of imaging pinholes 31 may at least include first imaging pinholes 31*a* and second imaging pinholes 31*b*. The second imaging pinhole 31*b* may be disposed between at least two adjacent first imaging pinholes 31*a*. The method for fingerprint recognition may include:

Step S101: controlling the fingerprint recognition light source FL to generate first light during a first time period, and recording information of a first image acquired by the light-sensitive fingerprint sensor FS.

During the step of S101, the first light may pass through the first imaging pinholes 31*a*, and the second imaging pinholes 31*b* may not allow the first light to pass through. The information of the first image acquired by the light-sensitive fingerprint sensor FS may be an image in an effective sensing area EA corresponding to the first imaging pinholes 31*a*.

Step S102: controlling the fingerprint recognition light source FL to generate second light during a second time period, and recording information of a second image acquired by the light-sensitive fingerprint sensor FS.

During the step of S102, the second light may pass through the second imaging pinholes 31*b*, and the first imaging pinholes 31*a* may not allow the second light to pass through. The information of the second image acquired by the light-sensitive fingerprint sensor FS may be an image in an effective sensing area EA corresponding to the second imaging pinholes 31*b*.

Step S103: recognizing a fingerprint based on the information of the first image and the information of the second image.

Figure 20:
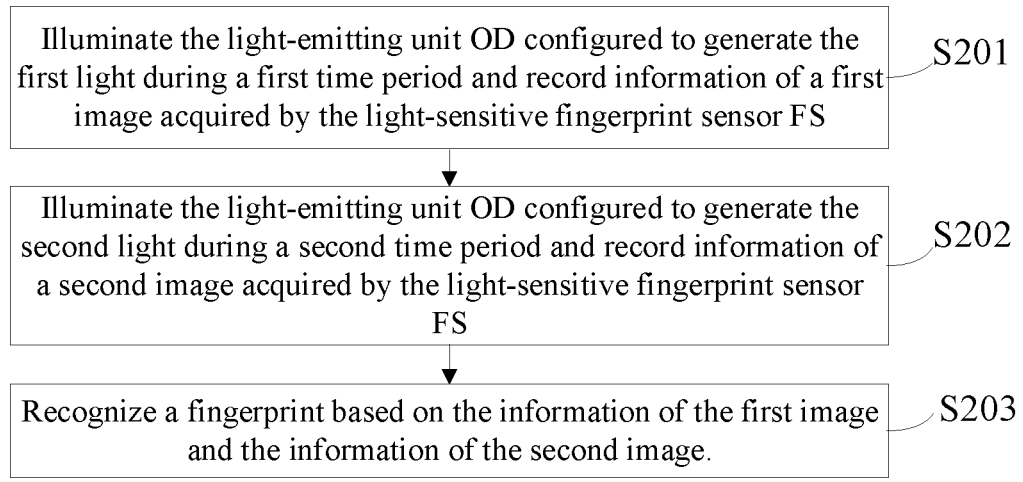
FIG. 20 illustrates a flow chat of another exemplary method for fingerprint recognition applicable to a display panel according to various embodiments of the present disclosure.

FIG. 20 illustrates a flow chat of another exemplary method for fingerprint recognition applicable to a display panel according to various embodiments of the present disclosure. In one embodiment with reference to FIG. 13 and FIG. 20, the first light and the second light may have different colors. Accordingly, the display panel may further include a first color filter 71 and a second color filter 72. The first color filter 71 may have a same color as the first light and the second color filter 72 may have a same color as the second light. Further, the first color filter 71 may cover the first imaging pinholes 31*a* and the second color filter 72 may cover the second imaging pinholes 31*b*. The light-emitting layer 20 of the display panel may be multiplexed as the fingerprint recognition light source FL, where the light-emitting layer 20 may include a light-emitting unit OD configured to generate the first light and a light-emitting unit OD configured to generate the second light. The method for fingerprint recognition may include:

Step S201: illuminating the light-emitting unit OD configured to generate the first light during a first time period and recording information of a first image acquired by the light-sensitive fingerprint sensor FS.

Step S202: illuminating the light-emitting unit OD configured to generate the second light during a second time period and recording information of a second image acquired by the light-sensitive fingerprint sensor FS.

Step S203: recognizing a fingerprint based on the information of the first image and the information of the second image.

Figure 21:
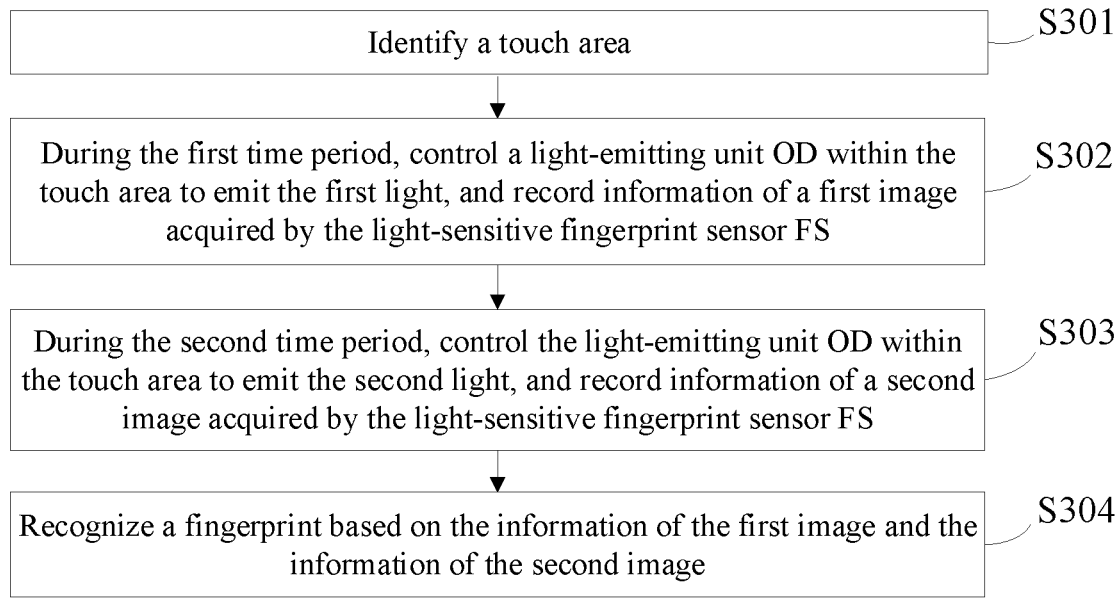
FIG. 21 illustrates a flow chat of another exemplary method for fingerprint recognition applicable to a display panel according to various embodiments of the present disclosure.

FIG. 21 illustrates a flow chat of another exemplary method for fingerprint recognition applicable to a display panel according to various embodiments of the present disclosure. In one embodiment with reference to FIGS. 13-14 and 21, the display panel may include a display period T1 and a fingerprint detection period t. During the display period T1, the light-emitting units OD may display corresponding images. The finger detection period t, within a touch period T2, may include a first time period t1 and a second time period t2. The method for fingerprint recognition may include:

Step S301: identifying a touch area.

Step S302: during the first time period, controlling a light-emitting unit OD within the touch area to emit the first light, and recording information of a first image acquired by the light-sensitive fingerprint sensor FS.

Step S303: during the second time period, controlling the light-emitting unit OD within the touch area to emit the second light, and recording information of a second image acquired by the light-sensitive fingerprint sensor FS.

Step S304: recognizing a fingerprint based on the information of the first image and the information of the second image.

Figure 22:
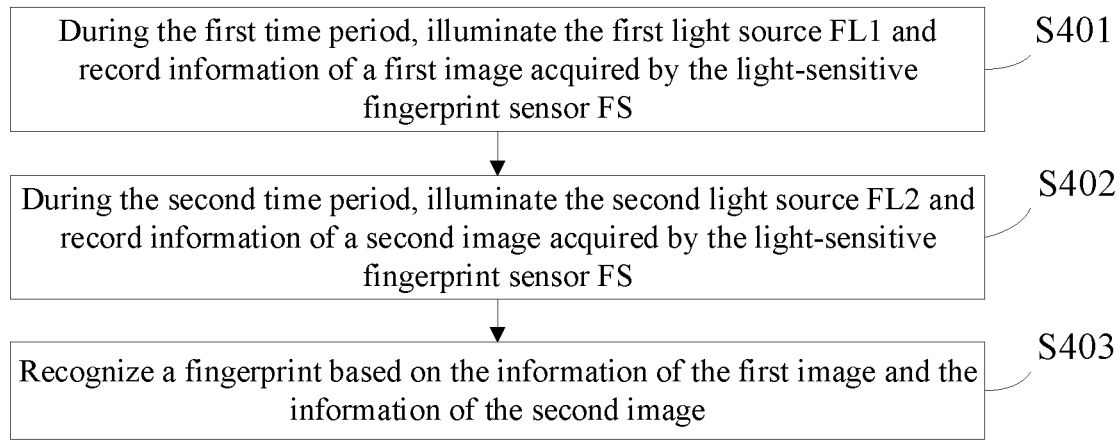
FIG. 22 illustrates a flow chat of another exemplary method for fingerprint recognition applicable to a display panel according to various embodiments of the present disclosure.

FIG. 22 illustrates a flow chat of another exemplary method for fingerprint recognition applicable to a display panel according to various embodiments of the present disclosure. In one embodiment with reference to FIGS. 16-17 and 22, a polarization direction of the first light may be perpendicular to a polarization direction of the second light. The fingerprint recognition light source FL may include a first fingerprint recognition light source FL1 and a second fingerprint recognition light source FL2, where the first fingerprint recognition light source FL1 may be configured to generate the first light and the second fingerprint recognition light source FL2 be configured to generate the second light. The display panel may further include a first polarization area 81 and a second polarization area 82. A polarization axis of the first polarization area 81 may have a same direction as the polarization direction of the first light, and the first polarization area 81 may cover the first imaging pinholes 31a. A polarization axis of the second polarization area 82 may have a same direction as the polarization direction of the second light, and the second polarization area 82 may cover the second imaging pinholes 31b. The method for fingerprint recognition may include:

Step S401: during the first time period, illuminating the first light source FL1 and recording information of a first image acquired by the light-sensitive fingerprint sensor FS.

Step S402: during the second time period, illuminating the second light source FL2 and recording information of a second image acquired by the light-sensitive fingerprint sensor FS.

Step S403: recognizing a fingerprint based on the information of the first image and the information of the second image.

The present disclosure also provides a display apparatus including any one of the display panels according to the aforementioned embodiments. The detailed technical description and beneficial effects corresponding to the display apparatus will not be repeated herein.

Figure 23:
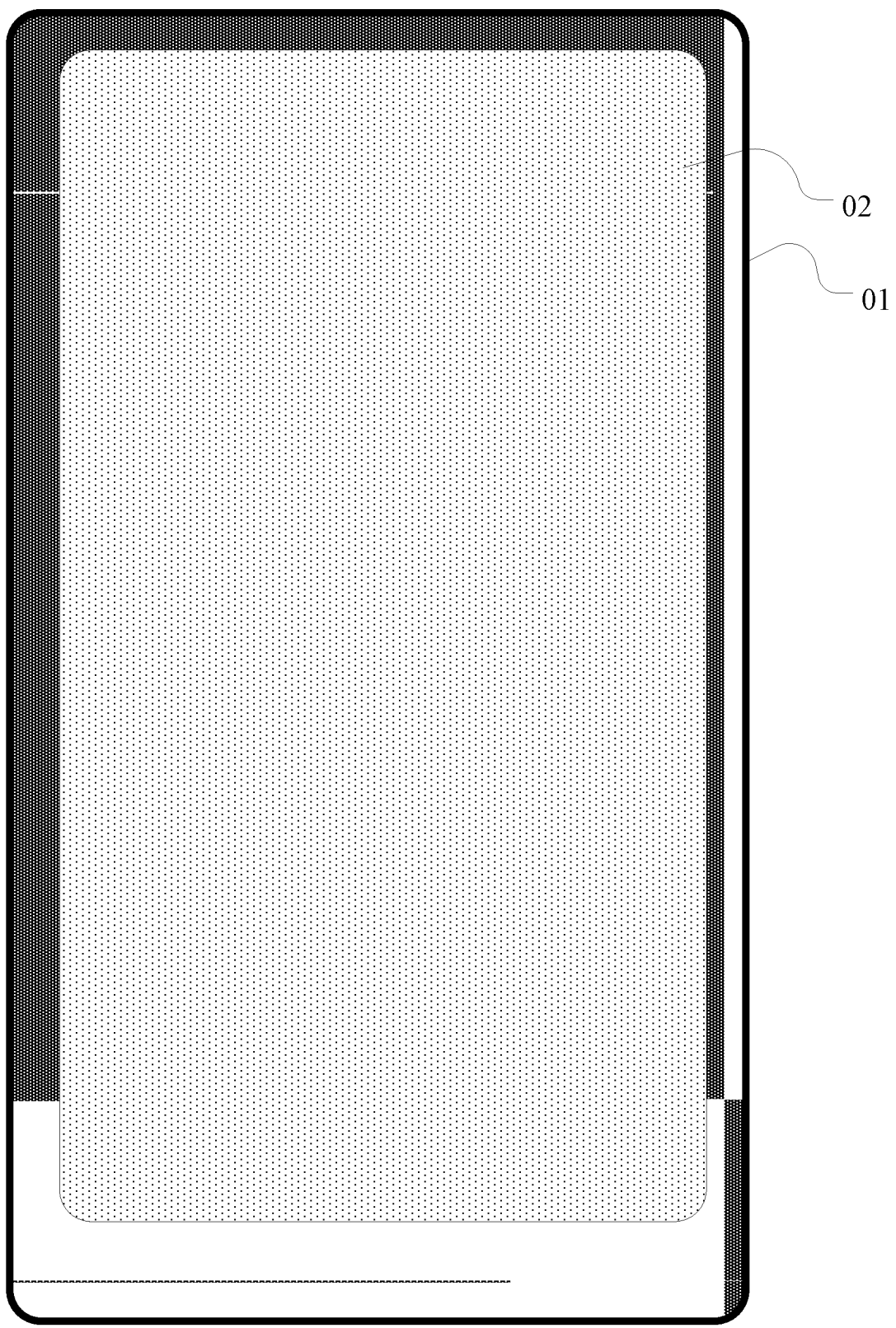
FIG. 23 illustrates a schematic diagram of an exemplary display apparatus according to various embodiments of the present disclosure.

FIG. 23 illustrates a schematic diagram of an exemplary display apparatus according to various embodiments of the present disclosure. With reference to FIG. 23, the display apparatus may include a case 01 and a display panel 02 disposed within the case 01, where the display panel 02 may be any one of the display panels according to the aforementioned embodiments.

As disclosed herein, the display panel and display apparatus for fingerprint recognition as well as the method for fingerprint recognition may have at least the following beneficial effects. At least two types of imaging pinholes may be arranged, and a same type of imaging pinholes may not be adjacent to each other. The fingerprint recognition light source corresponding to the at least two types of imaging pinholes may generate two types of light. Each type of imaging pinholes may only allow one type of light to pass through, while blocking other types of light. During the fingerprint recognition process, a fingerprint recognition cycle may at least include a first time period and a second time period. During each time period, the fingerprint recognition light source may emit only one type of light and an image formed in an imaging area on the light-sensitive fingerprint recognition sensor layer corresponding to one type of the imaging pinholes may be detected. Subsequently, by overlapping all of the detected images, the fingerprint recognition may be realized under a simplified control manner. Furthermore, based upon the realization of fingerprint recognition, the distance between the imaging pinholes may be reduced, thereby increasing the density of imaging pinholes and reducing the size of the imaging area corresponding to each imaging pinhole. As such, it may further reduce the probabilities of uneven brightness and distortion at edge positions of the sensing areas, thereby further improving the precision in fingerprint recognition.

Apparently, it is unnecessary for any one of the various embodiments of the present disclosure to simultaneously achieve each of the beneficial effects as disclosed above.

Although the present disclosure has been described in detail with reference to the foregoing embodiments, it is readily apparent to one ordinary skill in the art that the foregoing embodiments as described are merely for explanatory purpose, and not intended to be limiting. It is also apparent to one ordinary skill in the art that these embodiments may be modified or substituted, without departing from the scope of the various embodiments of the present disclosure. Instead, the scope of the present disclosure is defined by appended claims.

What is claimed is:

1. A display panel, comprising:
a base layer;
a light-emitting layer disposed on a side of the base layer, wherein the light-emitting layer includes a plurality of light-emitting units;
a light-shielding layer including a plurality of imaging pinholes, wherein:
at least a portion of an orthogonal projection of the plurality of imaging pinholes on the light-emitting layer is disposed between adjacent light-emitting units, and
the plurality of imaging pinholes at least includes first imaging pinholes and second imaging pinholes, and one of the second imaging pinholes is disposed between at least two adjacent first imaging pinholes;
a light-sensitive fingerprint sensor layer, wherein the light-shielding layer is disposed on a side of the light-sensitive fingerprint sensor layer facing towards a light-exiting surface of the display panel; and
a fingerprint recognition light source, wherein:
the fingerprint recognition light source generates first light during a first time period and generates second light during a second time period, wherein a polarization direction of the first light is perpendicular to a polarization direction of the second light,
the first light passes through the first imaging pinholes and the second imaging pinholes do not allow the first light to pass through, and
the second light passes through the second imaging pinholes and the first imaging pinholes do not allow the second light to pass through.

2. The display panel according to claim 1, wherein:
the light-sensitive fingerprint sensor layer is disposed on a side of the base layer away from the light-emitting layer.

3. The display panel according to claim 1, wherein:
the light-emitting layer is multiplexed as the fingerprint recognition light source, and the light-emitting layer includes one of the plurality of light-emitting units configured to generate the first light and one of the plurality of light-emitting units configured to generate the second light, and
during the first time period, the one of the plurality of light-emitting units configured to generate the first light is illuminated, and during the second time period, the one of the plurality of light-emitting units configured to generate the second light is illuminated.

4. The display panel according to claim 3, wherein:
the display panel has a display period and a fingerprint detection period, wherein the fingerprint detection period is within a touch period, and the first time period and the second time period are within the fingerprint detection period, and
during the first time period, one of the plurality of light-emitting units within a touch area emits the first light, and during the second time period, the one of the plurality of light-emitting units within the touch area emits the second light.

5. The display panel according to claim 1, wherein:
the display panel further includes a first polarization area and a second polarization area, wherein a polarization axis of the first polarization area has a same direction as the polarization direction of the first light, and a polarization axis of the second polarization area has a same direction as the polarization direction of the second light, and
the first polarization area covers the first imaging pinholes and the second polarization area covers the second imaging pinholes.

6. The display panel according to claim 5, wherein:
the first polarization area and the second polarization area are disposed on a same anistropic absorbing material layer.

7. The display panel according to claim 6, wherein:
the anistropic absorbing material layer includes a liquid crystal material layer, wherein the liquid crystal material layer has a first orientation at the first polarization area and a second orientation at the second polarization area, the second orientation being perpendicular to the first orientation.

8. The display panel according to claim 5, wherein:
the first polarization area and the second polarization area are disposed on a same metallic polarization diffraction grating layer.

9. The display panel according to claim 8, wherein:
the metallic polarization diffraction grating layer and the light-shielding layer are disposed on a same layer.

10. The display panel according to claim 5, wherein:
the fingerprint recognition light source includes a first light source and a second light source, wherein the first light source is configured to generate the first light and the second light source is configured to generate the second light, the first light source and the second light source being disposed in a border area of the display panel.

11. The display panel according to claim 1, wherein:
the plurality of imaging pinholes is arranged into a plurality of rows of imaging pinholes along a first direction and a plurality of columns of imaging pinholes along a second direction, the second direction intersecting the first direction, and
the first imaging pinholes and the second imaging pinholes are alternatively arranged along the first direction and the second direction.

12. The display panel according to claim 11, wherein:
for one of the first imaging pinholes and one of the second imaging pinholes adjacent to each other, an imaging area on the light-sensitive fingerprint sensor layer corresponding to the one of the first imaging pinholes overlaps with an imaging area on the light-sensitive fingerprint sensor layer corresponding to the one of the second imaging pinholes,
for any two first imaging pinholes, an imaging area on the light-sensitive fingerprint sensor layer corresponding to one of the any two first imaging pinholes non-overlaps with an effective sensing area on the light-sensitive fingerprint sensor layer corresponding to another one of the any two first imaging pinholes, and
for any two second imaging pinholes, an imaging area on the light-sensitive fingerprint sensor layer corresponding to one of the any two second imaging pinholes non-overlaps with an imaging area on the light-sensitive fingerprint sensor layer corresponding to another one of the any two second imaging pinholes.

13. The display panel according to claim 12, wherein:
the light-sensitive fingerprint sensor layer includes a plurality of light-sensitive fingerprint sensor groups, and each of the plurality of light-sensitive fingerprint sensor groups includes a plurality of light-sensitive fingerprint sensors, and
an effective sensing area on the light-sensitive fingerprint sensor layer corresponding to each of the plurality of imaging pinholes corresponds with one of the plurality of light-sensitive fingerprint sensor groups.

14. The display panel according to claim 1, wherein:
the display panel further includes a plurality of light-emitting unit groups, and
each of the plurality of light-emitting unit groups, corresponding to one of the plurality of imaging pinholes, includes a plurality of the light-emitting units.

15. A method for fingerprint recognition applicable to a display panel, wherein the display panel includes a light-sensitive fingerprint sensor, a fingerprint recognition light source and a plurality of imaging pinholes at least including first imaging pinholes and second imaging pinholes, and one of the second imaging pinholes is disposed between at least two adjacent first imaging pinholes, the method comprising the steps of:
controlling the fingerprint recognition light source to generate first light during a first time period and recording information of a first image acquired by the light-sensitive fingerprint sensor, wherein the first light passes through the first imaging pinholes and the second imaging pinholes do not allow the first light to pass through;
controlling the fingerprint recognition light source to generate second light during a second time period and recording information of a second image acquired by the light-sensitive fingerprint sensor, wherein the second light passes through the second imaging pinholes and the first imaging pinholes do not allow the second light to pass through, and a polarization direction of the first light is perpendicular to a polarization direction of the second light; and recognizing a fingerprint based on the information of the first image and the information of the second image.

16. The method for fingerprint recognition applicable to the display panel according to claim 15, wherein:

the fingerprint recognition light source includes a first light source and a second light source, the first light source being configured to generate the first light and the second light source being configured to generate the second light, the display panel further includes a first polarization area and a second polarization area, a polarization axis of the first polarization area has a same direction as a polarization direction of the first light, and a polarization axis of the second polarization area has a same direction as a polarization direction of the second light, the first polarization area covers the first imaging pinholes and the second polarization area covers the second imaging pinholes, the step of controlling the fingerprint recognition light source to generate the first light during the first time period includes illuminating the first light source during the first time period, and the step of controlling the fingerprint recognition light source to generate the second light during the second time period includes illuminating the second light source during the second time period.

17. A display apparatus, comprising:
a display panel, wherein the display panel comprises:
   a base layer;
   a light-emitting layer disposed on a side of the base layer, wherein the light-emitting layer includes a plurality of light-emitting units;
   a light-shielding layer including a plurality of imaging pinholes, wherein:
      at least a portion of an orthogonal projection of the plurality of imaging pinholes on the light-emitting layer is disposed between adjacent light-emitting units, and
      the plurality of imaging pinholes at least includes first imaging pinholes and second imaging pinholes, and one of the second imaging pinholes is disposed between at least two adjacent first imaging pinholes;
   a light-sensitive fingerprint sensor layer, wherein the light-shielding layer is disposed on a side of the light-sensitive fingerprint sensor layer facing towards a light-exiting surface of the display panel; and
a fingerprint recognition light source, wherein:
the fingerprint recognition light source generates first light at a first time period and generates second light at a second time period, wherein a polarization direction of the first light is perpendicular to a polarization direction of the second light,
the first light passes through the first imaging pinholes and the second imaging pinholes do not allow the first light to pass through, and
the second light passes through the second imaging pinholes and the first imaging pinholes do not allow the second light to pass through.

* * * * *